US008415812B2

(12) United States Patent
Dershem et al.

(10) Patent No.: US 8,415,812 B2
(45) Date of Patent: Apr. 9, 2013

(54) MATERIALS AND METHODS FOR STRESS REDUCTION IN SEMICONDUCTOR WAFER PASSIVATION LAYERS

(75) Inventors: Stephen M Dershem, San Diego, CA (US); Farhad G Mizori, San Diego, CA (US); James T Huneke, San Diego, CA (US)

(73) Assignee: Designer Molecules, Inc., San Diego, CA (US)

( * ) Notice: Subject to any disclaimer, the term of this patent is extended or adjusted under 35 U.S.C. 154(b) by 197 days.

(21) Appl. No.: 12/874,767

(22) Filed: Sep. 2, 2010

(65) Prior Publication Data

US 2011/0049731 A1 Mar. 3, 2011

Related U.S. Application Data

(60) Provisional application No. 61/239,758, filed on Sep. 3, 2009.

(51) Int. Cl.
*H01L 23/29* (2006.01)
*H01L 21/312* (2006.01)

(52) U.S. Cl.
USPC ............ 257/792; 257/E23.119; 257/E21.258; 438/780

(58) Field of Classification Search .................. 257/792, 257/E21.259, E23.119; 438/780
See application file for complete search history.

(56) References Cited

U.S. PATENT DOCUMENTS

| 3,901,845 | A |   | 8/1975  | Newbould          |        |
|-----------|---|---|---------|-------------------|--------|
| 4,111,879 | A |   | 9/1978  | Mori et al.       |        |
| 4,224,216 | A |   | 9/1980  | Locatelli et al.  |        |
| 4,374,869 | A |   | 2/1983  | Dorey, II et al.  |        |
| 4,574,031 | A |   | 3/1986  | Dorey, II et al.  |        |
| 4,968,738 | A |   | 11/1990 | Dershem           |        |
| 5,045,127 | A |   | 9/1991  | Dershem et al.    |        |
| 5,064,480 | A |   | 11/1991 | Dershem et al.    |        |
| 5,229,485 | A |   | 7/1993  | Kramer et al.     |        |
| 5,232,962 | A |   | 8/1993  | Dershem et al.    |        |
| 5,268,193 | A | * | 12/1993 | Beuhler et al. ............... | 427/96.6 |
| 5,284,959 | A |   | 2/1994  | Marien et al.     |        |
| 5,306,333 | A |   | 4/1994  | Dershem et al.    |        |
| 5,358,992 | A |   | 10/1994 | Dershem et al.    |        |

(Continued)

FOREIGN PATENT DOCUMENTS

CN   1187507 A   7/1998
EP   0488066      6/1992

(Continued)

OTHER PUBLICATIONS

Andersson et al., "Initiator-Free Photopolymerization of an Aliphatic Vinyl Ether-Maleimide Monomer", J Coatings Tech 69:91-95, 1997.

(Continued)

*Primary Examiner* — A O Williams
(74) *Attorney, Agent, or Firm* — The Law Office of Jane K. Babin, Professional Corporation; Jane K. Babin

(57) ABSTRACT

The present invention provides polyimide polymer materials for passivating semiconductor wafers and methods for fabricating thereof. The present invention further provides a device that includes a semiconductor wafer and a passivating layer disposed on the surface of the wafer, wherein the passivating layer comprises such polyimide polymers.

20 Claims, 3 Drawing Sheets

U.S. PATENT DOCUMENTS

| | | |
|---|---|---|
| 5,393,887 A | 2/1995 | Petit |
| 5,403,389 A | 4/1995 | Dershem |
| 5,447,988 A | 9/1995 | Dershem et al. |
| 5,489,641 A | 2/1996 | Dershem |
| 5,554,769 A | 9/1996 | Sheppard et al. |
| 5,602,205 A | 2/1997 | Singh et al. |
| 5,646,241 A | 7/1997 | Dershem et al. |
| 5,714,086 A | 2/1998 | Osuna et al. |
| 5,717,034 A | 2/1998 | Dershem et al. |
| 5,718,941 A | 2/1998 | Dershem et al. |
| 5,753,748 A | 5/1998 | Dershem et al. |
| 5,770,681 A | 6/1998 | Corley |
| 5,861,111 A | 1/1999 | Dershem et al. |
| 5,891,566 A | 4/1999 | Sakumoto et al. |
| 5,969,036 A | 10/1999 | Dershem |
| 5,973,166 A | 10/1999 | Mizori et al. |
| 6,034,194 A | 3/2000 | Dershem |
| 6,034,195 A | 3/2000 | Dershem |
| 6,063,828 A | 5/2000 | Ma et al. |
| 6,121,358 A | 9/2000 | Dershem et al. |
| 6,187,886 B1 | 2/2001 | Husson, Jr. et al. |
| 6,211,320 B1 | 4/2001 | Dershem et al. |
| 6,214,516 B1 | 4/2001 | Watson et al. |
| 6,214,923 B1 | 4/2001 | Goto et al. |
| 6,281,314 B1 | 8/2001 | Tong et al. |
| 6,303,743 B1 | 10/2001 | You et al. |
| 6,316,566 B1 | 11/2001 | Ma et al. |
| 6,355,750 B1 | 3/2002 | Herr |
| 6,369,124 B1 | 4/2002 | Hoyle et al. |
| 6,423,780 B1 | 7/2002 | Dershem et al. |
| 6,429,281 B1 | 8/2002 | Dershem et al. |
| 6,514,664 B1 | 2/2003 | Touky et al. |
| 6,521,731 B2 | 2/2003 | Dershem et al. |
| 6,620,946 B2 | 9/2003 | Dershem et al. |
| 6,743,852 B2 | 6/2004 | Dershem et al. |
| 6,750,301 B1 | 6/2004 | Bonneau et al. |
| 6,790,597 B2 | 9/2004 | Dershem |
| 6,825,245 B2 | 11/2004 | Dershem |
| 6,831,132 B2 | 12/2004 | Liu et al. |
| 6,852,814 B2 | 2/2005 | Dershem et al. |
| 6,855,745 B2 | 2/2005 | Hoyle et al. |
| 6,881,820 B1 | 4/2005 | Meador et al. |
| 6,916,856 B2 | 7/2005 | Dershem |
| 6,946,523 B2 | 9/2005 | Dershem et al. |
| 6,960,636 B2 | 11/2005 | Dershem et al. |
| 6,963,001 B2 | 11/2005 | Dershem et al. |
| 6,977,057 B2 | 12/2005 | Reitz et al. |
| 7,102,015 B2 | 9/2006 | Dershem et al. |
| 7,157,587 B2 | 1/2007 | Mizori et al. |
| 7,176,044 B2 | 2/2007 | Forray et al. |
| 7,199,249 B2 | 4/2007 | Liu et al. |
| 7,208,566 B2 | 4/2007 | Mizori et al. |
| 7,285,613 B2 | 10/2007 | Dershem et al. |
| 7,309,724 B2 | 12/2007 | Dershem et al. |
| 7,312,534 B2 | 12/2007 | Santos et al. |
| 7,517,925 B2 | 4/2009 | Dershem et al. |
| 7,550,825 B2 | 6/2009 | Santos et al. |
| 7,582,510 B2 | 9/2009 | Todd et al. |
| 7,678,879 B2 | 3/2010 | Dershem |
| 7,777,064 B2 | 8/2010 | Mizori |
| 7,786,234 B2 | 8/2010 | Dershem et al. |
| 7,786,248 B2 | 8/2010 | Dershem |
| 7,795,362 B2 | 9/2010 | Dershem |
| 7,868,113 B2 | 1/2011 | Dershem |
| 7,875,688 B2 | 1/2011 | Dershem et al. |
| 7,884,174 B2 | 2/2011 | Mizori et al. |
| 7,928,153 B2 | 4/2011 | Dershem |
| 8,008,419 B2 | 8/2011 | Dershem |
| 8,013,104 B2 | 9/2011 | Dershem |
| 8,039,663 B2 | 10/2011 | Dershem |
| 8,043,534 B2 | 10/2011 | Dershem |
| 2002/0007042 A1 | 1/2002 | Herr et al. |
| 2002/0062923 A1 | 5/2002 | Forray |
| 2002/0099168 A1 | 7/2002 | Dershem et al. |
| 2002/0188137 A1 | 12/2002 | Dershem et al. |
| 2002/0193541 A1 | 12/2002 | Dershem et al. |
| 2002/0198356 A1 | 12/2002 | Dershem et al. |
| 2003/0008992 A1 | 1/2003 | Dershem et al. |
| 2003/0055121 A1 | 3/2003 | Dershem et al. |
| 2003/0060531 A1 | 3/2003 | Dershem et al. |
| 2003/0087999 A1 | 5/2003 | Dershem et al. |
| 2003/0109666 A1 | 6/2003 | Dershem et al. |
| 2003/0125551 A1 | 7/2003 | Dershem et al. |
| 2003/0199638 A1 | 10/2003 | Liu et al. |
| 2003/0208016 A1 | 11/2003 | Dershem et al. |
| 2004/0006166 A1 | 1/2004 | Liu et al. |
| 2004/0019224 A1 | 1/2004 | Dershem et al. |
| 2004/0023926 A1 | 2/2004 | Guennouni et al. |
| 2004/0077798 A1 | 4/2004 | Dershem et al. |
| 2004/0082724 A1 | 4/2004 | Dershem et al. |
| 2004/0102566 A1 | 5/2004 | Forray et al. |
| 2004/0123948 A1 | 7/2004 | Dershem et al. |
| 2004/0225026 A1 | 11/2004 | Mizori et al. |
| 2004/0225045 A1 | 11/2004 | Forray |
| 2004/0225059 A1 | 11/2004 | Mizori et al. |
| 2005/0107542 A1 | 5/2005 | Liu et al. |
| 2005/0136620 A1 | 6/2005 | Dershem et al. |
| 2005/0137277 A1 | 6/2005 | Dershem et al. |
| 2005/0267254 A1 | 12/2005 | Mizori et al. |
| 2005/0272888 A1 | 12/2005 | Dershem et al. |
| 2006/0009578 A1 | 1/2006 | Dershem |
| 2006/0063014 A1 | 3/2006 | Forray |
| 2006/0069232 A1 | 3/2006 | Dershem |
| 2006/0116476 A1 | 6/2006 | Cheng |
| 2006/0142517 A1 | 6/2006 | Dershem |
| 2007/0155869 A1 | 7/2007 | Dershem et al. |
| 2007/0205399 A1 | 9/2007 | Mizori |
| 2007/0299154 A1 | 12/2007 | Dershem et al. |
| 2008/0017308 A1 | 1/2008 | Dershem et al. |
| 2008/0075961 A1 | 3/2008 | Mizori |
| 2008/0075963 A1 | 3/2008 | Dershem |
| 2008/0075965 A1 | 3/2008 | Dershem |
| 2008/0103240 A1 | 5/2008 | Dershem |
| 2008/0142158 A1 | 6/2008 | Dershem |
| 2008/0146738 A1 | 6/2008 | Dershem |
| 2008/0160315 A1 | 7/2008 | Forray et al. |
| 2008/0191173 A1 | 8/2008 | Dershem et al. |
| 2008/0210375 A1 | 9/2008 | Dershem et al. |
| 2008/0251935 A1 | 10/2008 | Dershem |
| 2008/0257493 A1 | 10/2008 | Dershem |
| 2008/0262191 A1 | 10/2008 | Mizori |
| 2009/0061244 A1 | 3/2009 | Dershem |
| 2009/0215940 A1 | 8/2009 | Dershem |
| 2009/0288768 A1 | 11/2009 | Dershem |
| 2010/0041803 A1 | 2/2010 | Dershem |
| 2010/0041823 A1 | 2/2010 | Dershem |
| 2010/0041832 A1 | 2/2010 | Dershem |
| 2010/0041845 A1 | 2/2010 | Dershem et al. |
| 2010/0056671 A1 | 3/2010 | Dershem |
| 2010/0063184 A1 | 3/2010 | Dershem |
| 2010/0113643 A1 | 5/2010 | Dershem |
| 2010/0144977 A1 | 6/2010 | Dershem |
| 2010/0207250 A1* | 8/2010 | Su et al. ............. 257/620 |
| 2010/0249276 A1 | 9/2010 | Dershem |
| 2011/0012259 A1* | 1/2011 | Grinman et al. ........ 257/738 |
| 2011/0017400 A1 | 1/2011 | Dershem |
| 2011/0049705 A1* | 3/2011 | Liu et al. ........... 257/737 |
| 2011/0121456 A1* | 5/2011 | Caron et al. ............ 257/741 |
| 2011/0130485 A1* | 6/2011 | Mizori et al. .......... 522/167 |
| 2011/0152466 A1 | 6/2011 | Dershem |
| 2012/0061823 A1* | 3/2012 | Wu et al. ............. 257/737 |
| 2012/0091577 A1* | 4/2012 | Hwang et al. ........... 257/737 |
| 2012/0098124 A1* | 4/2012 | Wu et al. ............. 257/737 |
| 2012/0120758 A1* | 5/2012 | Cohn et al. ............ 367/7 |

FOREIGN PATENT DOCUMENTS

| | | |
|---|---|---|
| EP | 0393713 | 6/1994 |
| JP | H01-167332 | 7/1987 |
| JP | 62-212390 | 9/1987 |
| JP | H02-639 | 1/1990 |
| JP | H02-124940 | 5/1990 |
| JP | H03-502941 | 7/1991 |
| JP | H10-505599 | 6/1998 |
| JP | 2001-100215 | 4/2001 |
| WO | 8604073 | 7/1986 |
| WO | 9011317 | 10/1990 |
| WO | 9607691 | 3/1996 |

| WO | 2004099331 | 11/2004 |
| WO | 2005121190 | 12/2005 |
| WO | 2007100329 | 7/2007 |
| WO | 2008077140 | 6/2008 |
| WO | 2008077141 | 6/2008 |
| WO | 2008092168 | 7/2008 |
| WO | 2008124797 | 10/2008 |
| WO | 2008130894 | 10/2008 |
| WO | 2009117729 | 9/2009 |
| WO | 2010019832 | 2/2010 |

OTHER PUBLICATIONS

Bagolini et al., "Dry etching release of structures in postprocessing surface micromachining using polyimide as a sacrificial layer", J. Micromech. Microeng. 12:769-72, 2002.

Callais et al., "New Polymerization Technologies for Advanced Materials", Arkema, Inc. Presentation (King of Prussia, PA)., Dec. 20, 2007.

Chen et al., "Interfacial Properties of Metal/Polyimide Layered Strucutres", in Micro Electronic Packaging Technology—Materials and Processes (Shieh ed; ASM International, Metals Park, Ohio), 1989, pp. 345-350.

Fouassier, "Photoinitiation, Photopolymerization, and Photocuring", Hanser/Gardner, 1995, 276-283.

Grenier-Loustalot et al., "Monofunctional maleimide or acetylene tennlnated model compounds-I. Molten state homopolymerization reactivity and kinetics", European Polymer Journal 34:1705-1714, 1998.

Hall et al., "Single mask wafer overcoat process using photodefinable polyimide", Solid State Technology Oct. 1999, pp. 1-5.

Lee et al., "Polyimidesiloxanes as Interlevel Dielectrics and Encapsulants", in Micro Electronic Packaging Technology—Materials and Processes (Shieh ed; ASM International, Metals Park, Ohio), 1989, pp. 359-367.

Mark et al., "Encyclopedia of Polymer Science and Engineering, 2 Ed.", vol. 2.1985, pp. 740-743.

Pai et al., "HD Microsystems Pyralin Polyimide Coating PI 2611", Dec. 10, 2003, viewed at https://louisville.edu/research/cleanroom/sops/hd-microsystems-pyralin-polyimide-coating-pi-2611.html.

Rutter, "VIA Formation in Thick Polyimide Layers for Silicon Hybrid Multi-Chip Modules", in Micro Electronic Packaging Technology—Materials and Processes (Shieh ed; ASM International, Metals Park, Ohio), 1989, 351-7.

Southward, "Surface Conductive and Reflective Silver-Polyimide Composite Films Prepared Via Thermally Induced Reduction of(1,1,1-Trifluoro-2,4-Pentanedionato)Silver(1) in a Curing Poly(Amic Acid) Matrix", Polymer Preprints, 39: 423-424, 1998.

Topper et al., "A Comparison of Thin Film Polymers for Wafer Level Packaging", in Micro Electronic Packaging Technology—Materials and Processes (Shieh ed; ASM International, Metals Park, Ohio), 2010, pp. 769-776.

Volant et al., "HD4004 PSPI Manufacturing, Integration and CPI Qualification", Presentation at Symposium on Polymers 2010viewed at http://hdmicrosystems.com/HDMicroSystems/en_US/pdf/Volant-HD4004_300mm_fabs.pdf.

Yamazaki et al., "Effect of N-substituents on polymerization reactivity of N-alkylitaconimides in radical polymerization", European Polymer Journal 33:157-162, 1997.

* cited by examiner

MATERIALS AND METHODS FOR STRESS REDUCTION IN SEMICONDUCTOR WAFER PASSIVATION LAYERS

CROSS REFERENCE TO RELATED APPLICATIONS

This application is claims the benefit of priority under 35 USC §119 of U.S. Provisional Application Ser. No. 61/239,758 filed Sep. 3, 2009, the entire disclosure of which is incorporated herein by reference.

FIELD OF THE INVENTION

The present invention relates generally to passivating layers for silicon wafers. More particularly, the invention relates to compositions containing low modulus photoimagable polyimides for use as passivating layers.

BACKGROUND OF THE INVENTION

Polyimides exhibit an attractive combination of thermal stability (>500° C.), mechanical toughness and chemical resistance, in addition to having excellent dielectric properties. Because of their high degree of ductility and inherently low CTE, polyimides can be readily implemented into a variety of microelectronic applications.

Polyimide films are frequently used as passivation layers for silicon wafers. Polyimide passivation layers are typically 4-6 microns in thickness, and protect the delicate thin films of metal and oxides on the chip surface from damage during handling and from induced stress after encapsulation in plastic molding compound. Patterning is simple and straightforward. Because of the low defect density and robust plasma etch resistance inherent with polyimide films, a "single mask" process can be implemented, which permits the polyimide layer to function both as a stress buffer and as a dry etch mask for an underlying silicon nitride layer. In addition, polyimide layers have been readily used for flip chip bonding applications, including both C-4 and dual-layer bond pad redistribution (BPR) applications.

Polyimides may also serve as an interlayer dielectric in both semiconductors and thin film multichip modules (MCM-D's). The low dielectric constant, low stress, high modulus, and inherent ductility of polyimide films make them well suited for these multiple layer applications. Other uses for polyimides include alignment and/or dielectric layers for displays, and as a structural layer in micromachining applications.

In the fabrication of microelectronic devices, polyimides are typically applied as a solution of the corresponding polyamic acid precursors onto a substrate, and then thermally cured into a smooth, rigid, intractable polymeric film or structural layer. The film can be patterned using a lithographic (photographic) process in conjunction with liquid photoresists. Typically, polyimides are formed in situ through cyclodehydration of the polyamic acid precursors. This imidization step also requires the evaporation of high boiling, polar aprotic solvents, which can be difficult to drive away as the polyimide is formed.

Existing polyimide passivation materials generate a high degree of stress on the wafer. This stress is known to cause delamination of the passivation material. Moreover, as silicon wafers have become thinner, it has been found that the polyimides used for passivation layers tend to warp the wafer upon thermal cure, resulting in a concave or convex wafer surface. This phenomenon creates a variety of problems for the semiconductor fabrication and packaging industry.

Conventional polyimide passivation materials are generally hydrophilic and usually require tedious multi-step processes to form the vias required for electrical interconnects. For example, polyimide materials have been used as interlayer dielectric materials in microelectronic devices such as integrated circuits (IC's) due to their having a dielectric constant that is lower than that of silicon dioxide. Also, such polyimide materials can serve as a planarization layer for IC's as they are generally applied in a liquid form, allowed to level, and subsequently cured. However, polyimide materials readily absorb moisture even after curing and this absorption can result in device failure. In addition, polyimides are generally not easily patterned as is often required in the manufacture of IC's and other microelectronic devices.

Accordingly, there is a need for hydrophobic, low modulus polyimides that are compatible with very thin silicon wafers, i.e., polyimide passivation layers that will not warp thin silicon wafers.

BRIEF DESCRIPTION OF THE DRAWINGS

FIG. 1 shows a developed photoimaged film in which the mask had 8 mil diameter opaque dots with 20 mil center-to-center spacing (8 mil dots, 20 mil spacing).

FIG. 2 shows a developed film that has 4.6 mil holes and 9.5 mil spacing between holes (5 mil dots, 10 mil spacing).

FIG. 3 shows a developed film with 3.4 mil holes and 10 mil spacing (3 mil dots, 100 mil spacing).

FIG. 4 shows schematically a semiconductor wafer and a passivating layer disposed on the surface of the wafer, having various wafer/passivating layer combinations.

SUMMARY OF THE INVENTION

Figure 1:
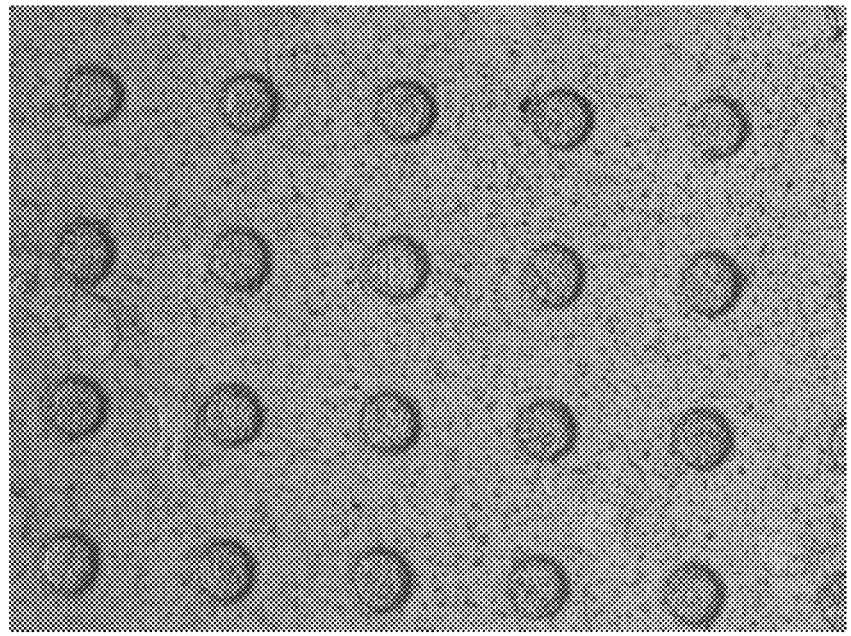
FIGS. 1-4 show films coated with passivation layers of the invention prepared with imide-extended BMI compounds that have been photoimaged with UV light and developed with toluene. The circular holes correspond to opaque areas (therefore un-cured, soluble regions of the film) in the mask that was used to pattern the film and the continuous film in which the holes are embedded correspond to transparent areas of the mask (therefore cured, insoluble regions of the film) used to pattern the film.

According to embodiments of the invention, a device is provided, comprising a semiconductor wafer and a passivating layer disposed on the surface of the wafer. According to some embodiments, the passivating layer is comprised of a polyimide polymer having the molecular weight fraction of the combined contents of nitrogen and oxygen that is less than about 20%, such as imide-extended bismaleimides, or graft polymaleimides described in U.S. Pat. No. 7,208,566, the contents of which is incorporated herein by reference in its entirety.

According to some embodiments, a suitable polyimide polymer having the molecular weight fraction of the combined contents of nitrogen and oxygen that is less than about 20%, may be a polyimide comprising a structure selected from the group consisting of structures I, II and III:

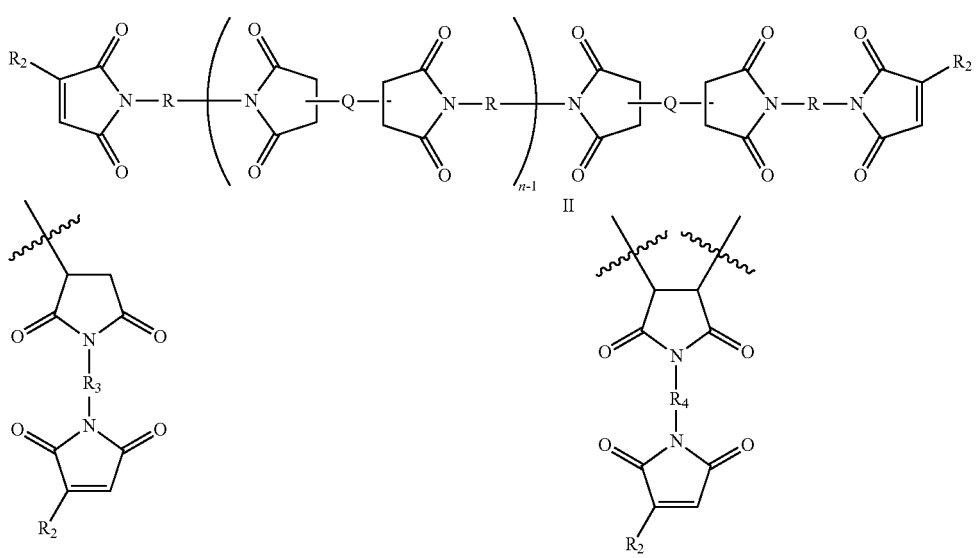

wherein each of R, R₃ and Q is independently selected from the group consisting of substituted or unsubstituted aliphatic, alkenyl, aromatic, heteroaromatic and siloxane moieties, R₂ in each structure I, II and III is independently selected from the group consisting of H or methyl, R₄ is selected from the group consisting of substituted or unsubstituted linear, branched, cyclic aliphatic or alkenyl moieties having between 2 and about 500 carbon atoms, and substituted or unsubstituted aromatic moieties, n is an integer having the value between 1 to about 10, and the symbol "~~~~" depicts schematically a macromolecular chain to which the structure II or III is covalently attached.

DETAILED DESCRIPTION

It is to be understood that both the foregoing general description and the following detailed description are exemplary and explanatory only and are not restrictive of the invention claimed. As used herein, the use of the singular includes the plural unless specifically stated otherwise. As used herein, "or" means "and/or" unless stated otherwise. Furthermore, use of the term "including" as well as other forms, such as "includes," and "included," is not limiting. The section headings used herein are for organizational purposes only and are not to be construed as limiting the subject matter described.

Unless specific definitions are provided, the nomenclatures utilized in connection with, and the laboratory procedures and techniques of analytical chemistry, synthetic organic and inorganic chemistry described herein are those known in the art, such as those set forth in "IUPAC Compendium of Chemical Terminology: IUPAC Recommendations (The Gold Book)" (McNaught ed.; International Union of Pure and Applied Chemistry, 2$^{nd}$ Ed., 1997) and "Compendium of Polymer Terminology and Nomenclature: IUPAC Recommendations 2008" (Jones et al., eds; International Union of Pure and Applied Chemistry, 2009). Standard chemical symbols are used interchangeably with the full names represented by such symbols. Thus, for example, the terms "hydrogen" and "H" are understood to have identical meaning. Standard techniques may be used for chemical syntheses, chemical analyses, and formulation.

DEFINITIONS

"About" as used herein means that a number referred to as "about" comprises the recited number plus or minus 1-10% of that recited number. For example, "about" 100 degrees can mean 95-105 degrees or as few as 99-101 degrees depending on the situation. Whenever it appears herein, a numerical range such as "1 to 20" refers to each integer in the given range; e.g., "1 to 20 carbon atoms" means that an alkyl group can contain only 1 carbon atom, 2 carbon atoms, 3 carbon atoms, etc., up to and including 20 carbon atoms (although the term "alkyl" also includes instances where no numerical range of carbon atoms is designated).

"Passivation" as used herein, refers to the process of making a material "passive" in relation to another material or condition. "Passivation layers" are commonly used to encapsulate semiconductor devices, such as semiconductor wafers, to isolate the device from its immediate environment and, thereby, to protect the device from oxygen, water, etc., as well airborne or space-borne contaminants, particulates, humidity and the like. Passivation layers are typically formed from inert materials that are used to coat the device. This encapsulation process also passivates semiconductor devices by terminating dangling bonds created during manufacturing processes and by adjusting the surface potential to either reduce or increase the surface leakage current associated with these devices.

In certain embodiments of the invention, passivation layers (PL) contain dielectric material that is disposed over a microelectronic device. Such PLs are typically patterned to form openings therein that provide for making electrical contact to the microelectronic device. Often a passivation layer is the last dielectric material disposed over a device and serves as a protective layer.

"Interlayer Dielectric Layer" (ILD) refers to a layer of dielectric material disposed over a first pattern of conductive traces and between such first pattern and a second pattern of conductive traces. Such ILD layer is typically patterned to form openings therein (generally referred to as "vias") to provide for electrical contact between the first and second patterns of conductive traces in specific regions. Other regions of such ILD layer are devoid of vias and thus prevent electrical contact between the conductive traces of the first and second patterns in such other regions.

"Coating composition" as used herein, refers to un-cured mixtures in which the individual components in the mixture retain the chemical and physical characteristics of the original individual components of which the mixture is made. Coating compositions are typically malleable and may be liquids, solutions of thermosetting resins, neat thermoplastic solids or another form that can be applied to an item so that it can coat another item.

"Cured coating," "cured film composition" or "cured compound" refers to resin components and mixtures obtained from reactive curable original compound(s) or mixture(s) thereof which have undergone a chemical and/or physical changes such that the original compound(s) or mixture(s) is(are) transformed into a solid, substantially non-flowing material. A typical curing process may involve crosslinking.

"Curable" means that an original compound(s) or composition material(s) can be transformed into a solid, substantially non-flowing material by means of chemical reaction, crosslinking, radiation crosslinking, or the like. Thus, compositions of the invention are curable, but unless otherwise specified, the original compound(s) or composition material(s) is(are) not cured.

"Photoimageable", as used herein, refers to the ability of a compound or composition to be selectively cured only in areas exposed to light. The exposed areas of the compound are thereby rendered cured and insoluble, while the unexposed area of the compound or composition remain un-cured and therefore soluble in a developer solvent. Typically, this operation is conducted using ultraviolet light as the light source and a photomask as the means to define where the exposure occurs. The selective patterning of dielectric layers on a silicon wafer can be carried out in accordance with various photolithographic techniques known in the art. In one method, a photosensitive polymer film is applied over the desired substrate surface and dried. A photomask containing the desired patterning information is then placed in close proximity to the photoresist film. The photoresist is irradiated through the overlying photomask by one of several types of imaging radiation including UV light, e-beam electrons, x-rays, or ion beam. Upon exposure to the radiation, the polymer film undergoes a chemical change (crosslinks) with concomitant changes in solubility. After irradiation, the substrate is soaked in a developer solution that selectively removes the non-crosslinked or unexposed areas of the film.

"Thermoplastic," as used herein, refers to the ability of a compound, composition or other material (e.g. a plastic) to dissolve in a suitable solvent or to melt to a liquid when heated and freeze to a solid, often brittle and glassy, state when cooled sufficiently.

"Thermoset," as used herein, refers to the ability of a compound, composition or other material to irreversibly "cure" resulting in a single tridimensional network that has greater strength and less solubility compared to the non-cured product. Thermoset materials are typically polymers that may be cured, for example, through heat (e.g. above 200° Celsius), via a chemical reaction (e.g. epoxy ring-opening, free-radical polymerization, etc.), or through irradiation (e.g. visible light, U.V. light, electron beam radiation, ion-beam radiation, or X-ray irradiation).

Thermoset materials, such as thermoset polymers or resins, are typically liquid or malleable forms prior to curing, and therefore may be molded or shaped into their final form, and/or used as adhesives. Curing transforms the thermoset resin into a rigid infusible and insoluble solid or rubber by a cross-linking process. Thus, energy and/or catalysts are typically added that cause the molecular chains to react at chemically active sites (unsaturated or epoxy sites, for example), linking the polymer chains into a rigid, 3-D structure. The cross-linking process forms molecules with a higher molecular weight and resultant higher melting point. During the reaction, when the molecular weight of the polymer has increased to a point such that the melting point is higher than the surrounding ambient temperature, the polymer becomes a solid material.

"Cross-linking," as used herein, refers to the attachment of two or more oligomer or longer polymer chains by bridges of an element, a molecular group, a compound, or another oligomer or polymer. Crosslinking may take place upon heating or exposure to light; some crosslinking processes may also occur at room temperature or a lower temperature. As cross-linking density is increased, the properties of a material can be changed from thermoplastic to thermosetting.

A "die" or "semiconductor die" as used herein, refers to a small block of semiconducting material, on which a functional circuit is fabricated.

A "flip-chip" semiconductor device is one in which a semiconductor die is directly mounted to a wiring substrate, such as a ceramic or an organic printed circuit board. Conductive terminals on the semiconductor die, usually in the form of solder bumps, are directly physically and electrically connected to the wiring pattern on the substrate without use of wire bonds, tape-automated bonding (TAB), or the like. Because the conductive solder bumps making connections to the substrate are on the active surface of the die or chip, the die is mounted in a face-down manner, thus the name "flip-chip."

"Underfill," "underfill composition" and "underfill material" are used interchangeably to refer to a material, typically polymeric compositions, used to fill gaps between a semiconductor component, such as a semiconductor die, and a substrate. "Underfilling" refers to the process of applying an underfill composition to a semiconductor component-substrate interface, thereby filling the gaps between the component and the substrate.

The term "monomer" refers to a molecule that can undergo polymerization or copolymerization thereby contributing constitutional units to the essential structure of a macromolecule (a polymer).

"Polymer" and "polymer compound" are used interchangeably herein, to refer generally to the combined products of a single chemical polymerization reaction. Polymers are produced by combining monomer subunits into a covalently bonded chain. Polymers that contain only a single type of monomer are known as "homopolymers," while polymers containing a mixture of monomers are known as "copolymers."

The term "copolymers" is inclusive of products that are obtained by copolymerization of two monomer species, those obtained from three monomers species (terpolymers), those obtained from four monomers species (quaterpolymers), etc. It is well known in the art that copolymers synthesized by chemical methods include, but are not limited to, molecules with the following types of monomer arrangements:

alternating copolymers, which contain regularly alternating monomer residues;

periodic copolymers, which have monomer residue types arranged in a repeating sequence;

random copolymers, which have a random sequence of monomer residue types;

statistical copolymers, which have monomer residues arranged according to a known statistical rule; and block copolymers, which have two or more homopolymer subunits linked by covalent bonds. The blocks of homopolymer within block copolymers, for example, can be of any length and can be blocks of uniform or variable length. Block copolymers with two or three distinct blocks are called diblock copolymers and triblock copolymers, respectively; and star copolymers, which have chains of monomer residues having different constitutional or configurational features that are linked through a central moiety.

The skilled artisan will appreciate that a single copolymer molecule may have different regions along its length that can be characterized as an alternating, periodic, random, etc. A copolymer product of a chemical polymerization reaction may contain individual polymeric fragments that each differ in the arrangement of monomer units. The skilled artisan will further be knowledgeable in methods for synthesizing each of these types of copolymers, and for varying reaction conditions to favor one type over another.

Furthermore, the length of a polymer chain according to the present invention, will typically vary over a range or average size produced by a particular reaction. The skilled artisan will be aware, for example, of methods for controlling the average length of a polymer chain produced in a given reaction and also of methods for size-selecting polymers after they have been synthesized.

Unless a more restrictive term is used, polymer is intended to encompass homopolymers, and copolymers having any arrangement of monomer subunits as well as copolymers containing individual molecules having more than one arrangement. With respect to length, unless otherwise indicated, any length limitations recited for the polymers described herein are to be considered averages of the lengths of the individual molecules in polymer.

"Thermoplastic elastomer" or "TPE", as used herein refers to a class of copolymers that consist of materials with both thermoplastic and elastomeric properties.

"Hard blocks" or "hard segments" as used herein refer to a block of a copolymer (typically a thermoplastic elastomer) that is hard at room temperature by virtue of a high melting point (Tm) or $T_g$. By contrast, "soft blocks" or "soft segments" have a $T_g$ below room temperature.

As used herein, "oligomer" or "oligomeric" refers to a polymer having a finite and moderate number of repeating monomers structural units. Oligomers of the invention typically have 2 to about 100 repeating monomer units; frequently 2 to about 30 repeating monomer units; and often 2 to about 10 repeating monomer units; and usually have a molecular weight up to about 3,000.

The skilled artisan will appreciate that oligomers and polymers may, depending on the availability of polymerizable groups or side chains, subsequently be incorporated as monomers in further polymerization or crosslinking reactions.

As used herein, "aliphatic" refers to any alkyl, alkenyl, cycloalkyl, or cycloalkenyl moiety.

"Aromatic hydrocarbon" or "aromatic" as used herein, refers to compounds having one or more benzene rings.

"Alkane," as used herein, refers to saturated straight-chain, branched or cyclic hydrocarbons having only single bonds. Alkanes have general formula $C_nH_{2n+2}$. "Cycloalkane," refers to an alkane having one or more rings in its structure.

As used herein, "alkyl" refers to straight or branched chain hydrocarbyl groups having from 1 up to about 500 carbon atoms. "Lower alkyl" refers generally to alkyl groups having 1 to 6 carbon atoms. The terms "alkyl" and "substituted alkyl" include, respectively, substituted and unsubstituted $C_1$-$C_{500}$ straight chain saturated aliphatic hydrocarbon groups, substituted and unsubstituted $C_2$-$C_{200}$ straight chain unsaturated aliphatic hydrocarbon groups, substituted and unsubstituted $C_4$-$C_{100}$ branched saturated aliphatic hydrocarbon groups, substituted and unsubstituted $C_1$-$C_{500}$ branched unsaturated aliphatic hydrocarbon groups.

For example, the definition of "alkyl" includes but is not limited to: methyl (Me), ethyl (Et), propyl (Pr), butyl (Bu), pentyl, hexyl, heptyl, octyl, nonyl, decyl, undecyl, ethenyl, propenyl, butenyl, penentyl, hexenyl, heptenyl, octenyl, nonenyl, decenyl, undecenyl, isopropyl (i-Pr), isobutyl (i-Bu), tert-butyl (t-Bu), sec-butyl (s-Bu), isopentyl, neopentyl, cyclopropyl, cyclobutyl, cyclopentyl, cyclohexyl, cycloheptyl, cyclooctyl, cyclopentenyl, cyclohexenyl, cycloheptenyl, cyclooctenyl, methylcyclopropyl, ethylcyclohexenyl, butenylcyclopentyl, tricyclodecyl, adamantyl, norbornyl and the like.

"Substituted alkyl" refers to alkyl moieties bearing substituents that include but are not limited to alkyl, alkenyl, alkynyl, hydroxy, oxo, alkoxy, mercapto, cycloalkyl, substituted cycloalkyl, heterocyclic, substituted heterocyclic, aryl, substituted aryl (e.g., aryl$C_{1-10}$alkyl or aryl$C_{1-10}$alkyloxy), heteroaryl, substituted heteroaryl (e.g., heteroaryl$C_{1-10}$alkyl), aryloxy, substituted aryloxy, halogen, haloalkyl (e.g., trihalomethyl), cyano, nitro, nitrone, amino, amido, carbamoyl, =O, =CH—, —C(O)H, —C(O)O—, —C(O)—, —S—, —S(O)$_2$—, —OC(O)—O—, —NR—C(O)—, —NR—C(O)—NR—, —OC(O)—NR—, where R is H or lower alkyl, acyl, oxyacyl, carboxyl, carbamate, sulfonyl, sulfonamide, sulfuryl, $C_{1-10}$alkylthio, aryl$C_{1-10}$alkylthio, $C_{1-10}$alkylamino, aryl$C_{1-10}$alkylamino, N-aryl-N—$C_{1-10}$alkylamino, $C_{1-10}$alkyl carbonyl, aryl$C_{1-10}$alkylcarbonyl, $C_{1-10}$alkylcarboxy, aryl $C_{1-10}$alkylcarboxy, $C_{1-10}$alkyl carbonylamino, aryl $C_{1-10}$alkylcarbonylamino, tetrahydrofuryl, morpholinyl, piperazinyl, and hydroxypyronyl.

As used herein, "cycloalkyl" refers to cyclic ring-containing groups containing in the range of about 3 up to about 20 carbon atoms, typically 3 to about 15 carbon atoms. In certain embodiments, cycloalkyl groups have in the range of about 4 up to about 12 carbon atoms, and in yet further embodiments, cycloalkyl groups have in the range of about 5 up to about 8 carbon atoms. and "substituted cycloalkyl" refers to cycloalkyl groups further bearing one or more substituents as set forth below.

As used herein, the term "aryl" represents an unsubstituted, mono-, di- or trisubstituted monocyclic, polycyclic, biaryl aromatic groups covalently attached at any ring position capable of forming a stable covalent bond, certain preferred points of attachment being apparent to those skilled in the art (e.g., 3-phenyl, 4-naphtyl and the like). The aryl substituents are independently selected from the group consisting of halo, —OH, —SH, —CN, —NO$_2$, trihalomethyl, hydroxypyronyl, $C_{1-10}$alkyl, aryl$C_{1-10}$alkyl, $C_{1-10}$alkyloxy$C_{1-10}$alkyl, aryl$C_{1-10}$alkyloxy$C_{1-10}$alkyl, $C_{1-10}$alkylthio$C_{1-10}$alkyl, aryl$C_{1-10}$alkylthio$C_{1-10}$alkyl, $C_{1-10}$alkylamino$C_{1-10}$alkyl, aryl$C_{1-10}$alkylamino$C_{1-10}$alkyl, N-aryl-N—$C_{1-10}$alkylamino$C_{1-10}$alkyl, $C_{1-10}$alkylcarbonyl$C_{1-10}$alkyl, aryl $C_{1-10}$alkylcarbonyl $C_{1-10}$alkyl, $C_{1-10}$alkylcarboxy$C_{1-10}$alkyl, aryl$C_{1-10}$alkylcarboxy$C_{1-10}$alkyl, $C_{1-10}$alkylcarbonylamino$C_{1-10}$alkyl, and aryl$_{1-10}$alkylcarbonylamino$C_{1-10}$alkyl.

Some specific examples of moieties encompassed by the definition of "aryl" include but are not limited to phenyl, biphenyl, naphthyl, dihydronaphthyl, tetrahydronaphthyl, indenyl, indanyl, azulenyl, anthryl, phenanthryl, fluorenyl, pyrenyl and the like. "Substituted aryl" refers to aryl groups further bearing one or more substituents as set forth below.

As used herein, "arylene" refers to a divalent aryl moiety. "Substituted arylene" refers to arylene moieties bearing one or more substituents as set forth above.

As used herein, "alkylaryl" refers to alkyl-substituted aryl groups and "substituted alkylaryl" refers to alkylaryl groups further bearing one or more substituents as set forth below.

As used herein, "arylalkyl" refers to aryl-substituted alkyl groups and "substituted arylalkyl" refers to arylalkyl groups further bearing one or more substituents as set forth below. Some examples of included but are not limited to (4-hydroxyphenyl)ethyl, or (2-aminonaphthyl) hexenyl.

As used herein, "arylalkenyl" refers to aryl-substituted alkenyl groups and "substituted arylalkenyl" refers to arylalkenyl groups further bearing one or more substituents as set forth below.

As used herein, "arylalkynyl" refers to aryl-substituted alkynyl groups and "substituted arylalkynyl" refers to arylalkynyl groups further bearing one or more substituents as set forth below.

As used herein, "aroyl" refers to aryl-carbonyl species such as benzoyl and "substituted aroyl" refers to aroyl groups further bearing one or more substituents as set forth below.

As used herein, "hetero" refers to groups or moieties containing one or more heteroatoms such as N, O, Si and S. Thus, for example "heterocyclic" refers to cyclic (i.e., ring-containing) groups having e.g. N, O, Si or S as part of the ring structure, and having in the range of 3 up to 14 carbon atoms. "Heteroaryl" and "heteroalkyl" moieties are aryl and alkyl groups, respectively, containing e.g. N, O, Si or S as part of their structure. The terms "heteroaryl", "heterocycle" or "heterocyclic" refer to a monovalent unsaturated group having a single ring or multiple condensed rings, from 1 to 8 carbon atoms and from 1 to 4 hetero atoms selected from nitrogen, sulfur or oxygen within the ring.

The definition of heteroaryl includes but is not limited to thienyl, benzothienyl, isobenzothienyl, 2,3-dihydrobenzothienyl, furyl, pyranyl, benzofuranyl, isobenzofuranyl, 2,3-dihydrobenzofuranyl, pyrrolyl, pyrrolyl-2,5-dione, 3-pyrrolinyl, indolyl, isoindolyl, 3H-indolyl, indolinyl, indolizinyl, indazolyl, phthalimidyl (or isoindoly-1,3-dione), imidazolyl. 2H-imidazolinyl, benzimidazolyl, pyridyl, pyrazinyl, pyradazinyl, pyrimidinyl, triazinyl, quinolyl, isoquinolyl, 4H-quinolizinyl, cinnolinyl, phthalazinyl, quinazolinyl, quinoxalinyl, 1,8-naphthyridinyl, pteridinyl, carbazolyl, acridinyl, phenazinyl, phenothiazinyl, phenoxazinyl, chromanyl, benzodioxolyl, piperonyl, purinyl, pyrazolyl, triazolyl, tetrazolyl, thiazolyl, isothiazolyl, benzthiazolyl, oxazolyl, isoxazolyl, benzoxazolyl, oxadiazolyl, thiadiazolyl, pyrrolidinyl-2,5-dione, imidazolidinyl-2,4-dione, 2-thioxo-imidazolidinyl-4-one, imidazolidinyl-2,4-dithione, thiazolidinyl-2,4-dione, 4-thioxo-thiazolidinyl-2-one, piperazinyl-2,5-dione, tetrahydro-pyridazinyl-3,6-dione, 1,2-dihydro-[1,2,4,5]tetrazinyl-3,6-dione, [1,2,4,5]tetrazinanyl-3,6-dione, dihydro-pyrimidinyl-2,4-dione, pyrimidinyl-2,4,6-trione, 1H-pyrimidinyl-2,4-dione, 5-iodo-1H-pyrimidinyl-2,4-dione, 5-chloro-1H-pyrimidinyl-2,4-dione, 5-methyl-1H-pyrimidinyl-2,4-dione, 5-isopropyl-1H-pyrimidinyl-2,4-dione, 5-propynyl-1H-pyrimidinyl-2,4-dione, 5-trifluoromethyl-1H-pyrimidinyl-2,4-dione, 6-amino-9H-purinyl, 2-amino-9H-purinyl, 4-amino-1H-pyrimidinyl-2-one, 4-amino-5-fluoro-1H-pyrimidinyl-2-one, 4-amino-5-methyl-1H-pyrimidinyl-2-one, 2-amino-1,9-dihydro-purinyl-6-one, 1,9-dihydro-purinyl-6-one, 1H-[1,2,4]triazolyl-3-carboxylic acid amide, 2,6-diamino-N.sub.6-cyclopropyl-9H-purinyl, 2-amino-6-(4-methoxyphenylsulfanyl)-9H-purinyl, 5,6-dichloro-1H-benzoimidazolyl, 2-isopropylamino-5,6-dichloro-1H-benzoimidazolyl, 2-bromo-5,6-dichloro-1H-benzoimidazolyl, and the like. Furthermore, the term "saturated heterocyclic" represents an unsubstituted, mono-, di- or trisubstituted monocyclic, polycyclic saturated heterocyclic group covalently attached at any ring position capable of forming a stable covalent bond, certain preferred points of attachment being apparent to those skilled in the art (e.g., 1-piperidinyl, 4-piperazinyl and the like).

Hetero-containing groups may also be substituted. For example, "substituted heterocyclic" refers to a ring-containing group having in the range of 3 up to 14 carbon atoms that contains one or more heteroatoms and also bears one or more substituents, as set forth above. Examples of substituents include, but are not limited to halo, —OH, —SH, —CN, —NO$_2$, trihalomethyl, hydroxypyronyl, C$_{1-10}$alkyl, arylC$_{1-10}$alkyl, C$_{1-10}$alkyloxyC$_{1-10}$alkyl, arylC$_{1-10}$alkyloxy C$_{1-10}$alkyl, C$_{1-10}$alkylthioC$_{1-10}$alkyl, arylC$_{1-10}$alkylthioC$_{1-10}$alkyl, C$_{1-10}$alkylaminoC$_{1-10}$alkyl, arylC$_{1-10}$alkylamino C$_{1-10}$alkyl, N-aryl-N—C$_{1-10}$alkylaminoC$_{1-10}$alkyl, C$_{1-10}$alkylcarbonylC$_{1-10}$alkyl, arylC$_{1-10}$-alkylcarbonyl C$_{1-10}$alkyl, C$_{1-10}$alkylcarboxyC$_{1-10}$alkyl, arylC$_{1-10}$alkylcarboxyC$_{1-10}$alkyl C$_{1-10}$alkylcarbonylaminoC$_{1-10}$alkyl, and arylC$_{1-10}$alkylcarbonylamino C$_{1-10}$alkyl.

As used herein, "alkenyl," "alkene" or "olefin" refers to straight or branched chain unsaturated hydrocarbyl groups having at least one carbon-carbon double bond, and having in the range of about 2 up to 500 carbon atoms. In certain embodiments, alkenyl groups have in the range of about 5 up to about 250 carbon atoms, 5 up to about 100 carbon atoms, 5 up to about 50 carbon atoms or 5 up to about 25 carbon atoms. In other embodiments, alkenyl groups have in the range of about 6 up to about 500 carbon atoms, 8 up to about 500 carbon atoms, 10 up to about 500 carbon atoms or 20 up to about 500 carbon atoms or 50 up to about 500 carbon atoms. In yet further embodiments, alkenyl groups have in the range of about 6 up to about 100 carbon atoms, 10 up to about 100 carbon atoms, 20 up to about 100 carbon atoms or 50 up to about 100 carbon atoms, while in other embodiments, alkenyl groups have in the range of about 6 up to about 50 carbon atoms, 6 up to about 25 carbon atoms, 10 up to about 50 carbon atoms, or 10 up to about 25 carbon atoms. "Substituted alkenyl" refers to alkenyl groups further bearing one or more substituents as set forth above.

As used herein, "alkylene" refers to a divalent alkyl moiety, and "oxyalkylene" refers to an alkylene moiety containing at least one oxygen atom instead of a methylene (CH$_2$) unit. "Substituted alkylene" and "substituted oxyalkylene" refer to alkylene and oxyalkylene groups further bearing one or more substituents as set forth above.

As used herein, "alkynyl" refers to straight or branched chain hydrocarbyl groups having at least one carbon-carbon triple bond, and having in the range of 2 up to about 100 carbon atoms, typically about 4 to about 50 carbon atoms, and frequently about 8 to about 25 carbon atoms. "Substituted alkynyl" refers to alkynyl groups further bearing one or more substituents as set forth below.

As used herein, "arylene" refers to a divalent aryl moiety. "Substituted arylene" refers to arylene moieties bearing one or more substituents as set forth above.

"Imide" as used herein, refers to a functional group having two carbonyl groups bound to a primary amine or ammonia. The general formula of an imide is:

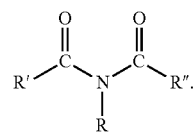

"Polyimides" are polymers of imide-containing monomers. Polyimides are typically linear or cyclic. Non-limiting examples of linear and cyclic (e.g. an aromatic heterocyclic polyimide) polyimides are shown below for illustrative purposes.

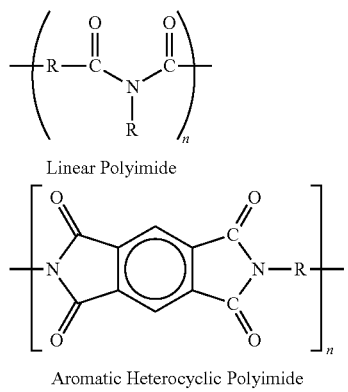

Linear Polyimide

Aromatic Heterocyclic Polyimide

"Maleimide," as used herein, refers to an N-substituted maleimide having the formula as shown below:

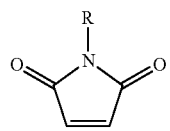

where R is an aromatic, heteroaromatic, aliphatic, or polymeric moiety.

"Bismaleimide" or "BMI", as used herein, refers to compound in which two imide moieties are linked by a bridge, i.e. a compound a polyimide having the general structure shown below:

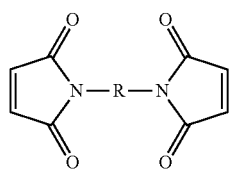

where R is an aromatic, heteroaromatic, aliphatic, or polymeric moiety. BMIs can cure through an addition rather than a condensation reaction, thus avoiding problems resulting from the formation of volatiles. BMIs can be cured by a vinyl-type polymerization of a pre-polymer terminated with two maleimide groups.

As used herein, "maleate" refers to a compound bearing at least one moiety having the structure:

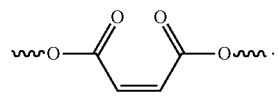

As used herein, the terms "halogen," "halide," or "halo" include fluorine, chlorine, bromine, and iodine.

As used herein, "siloxane" refers to any compound containing a Si—O moiety. Siloxanes may be either linear or cyclic. In certain embodiments, siloxanes of the invention include 2 or more repeating units of Si—O. Exemplary cyclic siloxanes include hexamethylcyclotrisiloxane, octamethylcyclotetrasiloxane, decamethylcyclopentasiloxane, dodecamethylcyclohexasiloxane and the like.

The term "epoxy" also refers to thermosetting epoxide polymers that cure by polymerization and crosslinking when mixed with a catalyzing agent or "hardener," also referred to as a "curing agent" or "curative." Epoxies of the present invention include, but are not limited to aliphatic, cycloaliphatic, glycidyl ether, glycidyl ester, glycidyl amine epoxies, and the like, and combinations thereof.

As used herein, a "primary amine terminated difunctional siloxane bridging group" refers to a moiety having the structural formula:

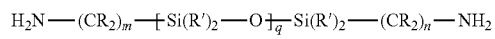

where each R is H or Me, each R' is independently H, lower alkyl, or aryl; each of m and n is an integer having the value between 1 to about 10, and q is an integer having the value between 1 and 100.

As used herein, the term "free radical initiator" refers to any chemical species which, upon exposure to sufficient energy (e.g., light, heat, or the like), decomposes into parts which are uncharged, but every one of such part possesses at least one unpaired electron.

As used herein, the term "coupling agent" refers to chemical species that are capable of bonding to a mineral surface and which also contain polymerizably reactive functional group(s) so as to enable interaction with the adhesive composition. Coupling agents thus facilitate linkage of the die-attach paste to the substrate to which it is applied.

The term "solvent," as used herein, refers to a liquid that dissolves a solid, liquid, or gaseous solute, resulting in a solution. "Co-solvent" refers to a second, third, etc. solvent used with a primary solvent.

As used herein, "polar protic solvents" are ones that contains an O—H or N—H bond, while "polar aprotic solvents" do not contain an O—H or N—H bond.

"Glass transition temperature" or "$T_g$": is used herein to refer to the temperature at which an amorphous solid, such as a polymer, becomes brittle on cooling, or soft on heating. More specifically, it defines a pseudo second order phase transition in which a supercooled melt yields, on cooling, a glassy structure and properties similar to those of crystalline materials e.g. of an isotropic solid material.

"Modulus" or "Young's modulus" as used herein, is a measure of the stiffness of a material. Within the limits of elasticity, modulus is the ratio of the linear stress to the linear strain which can be determined from the slope of a stress-strain curve created during tensile testing.

The "Coefficient of Thermal Expansion" or "CTE" is a term of art describing a thermodynamic property of a substance. The CTE relates a change in temperature to the change in a material's linear dimensions. As used herein "$\alpha_1$ CTE" or "$\alpha_1$" refers to the CTE before the $T_g$, while "$\alpha_2$ CTE" refers to the CTE after the $T_g$.

"Thixotropy" as used herein, refers to the property of a material which enables it to stiffen or thicken in a relatively short time upon standing, but upon agitation or manipulation to change to low-viscosity fluid; the longer the fluid undergoes shear stress, the lower its viscosity. Thixotropic materials are therefore gel-like at rest but fluid when agitated and have high static shear strength and low dynamic shear strength, at the same time.

"Thermogravimetric analysis" or "TGA" refers to a method of testing and analyzing a material to determine changes in weight of a sample that is being heated in relation to change in temperature. "Decomposition onset" refers to a temperature when the loss of weight in response to the increase of the temperature indicates that the sample is beginning to degrade.

The term "Degree of Planarization" refers to the ability of the coating material to level or planarize the previously deposited layer with its underlying topography.

The parameter "molecular weight fraction of the combined contents of nitrogen and oxygen" is calculated as follows:

MFW=[(14×number of N in the polyamide)+(16× number of O in the polyamide]/MWP, where MFW is molecular weight fraction of the combined contents of nitrogen and oxygen, and MWP is the molecular weight of the polyamide.

EMBODIMENTS OF THE INVENTION

According to embodiments of the present invention, there are provided devices comprising a semiconductor wafer and a passivating layer disposed on the surface of the wafer. The passivating layer is comprised of a polyimide polymer having the molecular weight fraction of the combined contents of nitrogen and oxygen that is less than about 20%, such less than about 15%, for example, below about 12%. For comparison, the nitrogen plus oxygen molecular weight fraction of the traditional polyimide passivation coating materials is typically in the range of 21-36%.

The polyimides that are utilized in the embodiments of the present invention to prepare the passivating layer are less subject to stress effects than previously used polyimides; therefore, the polyimides used in the present invention are compatible with very thin silicon wafers. The polyimides of this invention are fully imidized, and thus do not require further heat processing to cyclodehydrate amic acid residues after the passivation layer has been applied to a wafer. Polyimides suitable for use in the methods and materials of the present invention can be supplied pre-dissolved in a relatively low boiling solvent (such as solvents boiling at about 100° C.).

Another desirable feature of the polyimide compounds of this invention is that they have much lower moisture uptake than the traditional polymidide passivation coatings. A further attractive feature of invention polyimides is that they are optionally photoimageable, thereby allowing for patterning of the passivation layer.

According to some embodiments, a suitable polyimide polymer (i.e., a polyimide having the molecular weight fraction of the combined contents of nitrogen and oxygen that is less than about 20%), may be a polyimide comprising a structure selected from the group consisting of structures I, II and III:

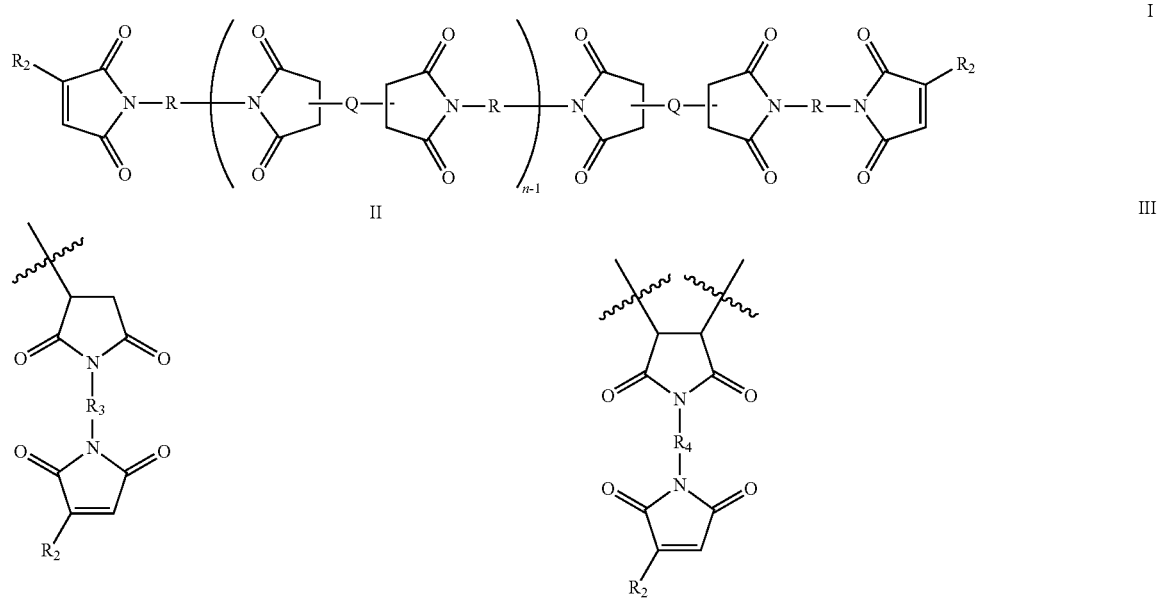

where each of R, $R_3$ and Q is independently selected from the group consisting of substituted or unsubstituted aliphatic, alkenyl, aromatic, heteroaromatic and siloxane moieties, $R_2$ in each structure I, II and III is independently selected from the group consisting of H or methyl, $R_4$ is selected from the group consisting of substituted or unsubstituted linear, branched, cyclic aliphatic or alkenyl moieties having between 2 and about 500 carbon atoms, and substituted or unsubstituted aromatic moieties, n is an integer having the value between 1 to about 10, and the symbol "~~~" depicts schematically a macromolecular chain to which the structure II or III is covalently attached.

For example, each of R, $R_3$ and Q in structures I or II can be an unsubstituted aromatic or heteroaromatic moiety having between 6 and about 14 carbon atoms. In other embodiments, each of R, $R_3$ and Q each of R, $R_3$ and Q in structures I or II can be a substituted or unsubstituted siloxane moiety having between 2 and about 50 silicon atoms. Such a siloxane moiety can be a polysiloxane, for example, a polysiloxane comprising repeating units selected from dimethylsiloxane, methylphenylsiloxane, diphenylsiloxane or combinations thereof.

In some embodiments, in structures I-III, substituted aliphatic, aromatic, heteroaromatic, or siloxane moieties may comprise substituents selected from an alkyl, an alkenyl, an alkynyl, hydroxyl, oxo, an alkoxy, mercapto, a cycloalkyl, a substituted cycloalkyl, a heterocyclic, a substituted heterocyclic, an aryl, a substituted aryl, a heteroaryl, a substituted heteroaryl, an aryloxy, a substituted aryloxy, a halogen, a haloalkyl, cyano, nitro, nitrone, an amino, an amido, —C(O)H, —C(O)—, —C(O)—, —S—, —S(O)$_2$—, —OC(O)—O—, —NR—C(O)—, —NR—C(O)—NR—, and —OC(O)—NR—, wherein R can be any of H, a lower alkyl, an acyl, an oxyacyl, carboxyl, carbamate, sulfonyl, sulfonamide or sulfuryl.

In certain embodiments, the present invention provides chain-propagated polyimide polymers having a flexible aliphatic backbone in place of the traditional aromatic ether backbone found in conventional polyimide polymers. Although both invention polymers and conventional polymers have the same high temperature resistance due to their imide linkage, invention polyimide polymer advantageously have low modulus due to the flexible backbone. In addition, invention polyimide polymers display lower shrinkage than conventional polyimide polymers due to the chain propagation mechanism, thereby reducing stress on a wafer passivated with such polymers. Taken together, the methods and materials of the invention reduce the potential for delamination and warpage of semiconductor passivating layers.

The polyimide polymers according to the invention can be used in conventional process flow for building the wafer passivation layer. Table 1 below compares the properties of the invention polyimide polymers with those of the conventional polyimide polymers currently used for wafer passivation.

tents of which is incorporated by reference herein in its entirety. For example, the experiments detailed below in Example 1 utilitize a maleimide functional oligomer (R1184) the synthesis of which is outlined in Example 5 of the U.S. Pat. No. 7,208,566.

Compositions Containing Low Modulus Polyimides

The present invention provides compositions containing at least one low modulus polyimide compound. For example, the low modulus polyimides may be used independently as the monomer in a polymeric composition, such as a wafer passivation composition, or may be combined with other materials and reagents to prepare wafer passivation compositions. In certain embodiments, the low modulus polyimides may be combined with other monomers and/or resins to prepare wafer passivation compositions. The low modulus polyimides may be used as the sole photoimageable thermoset/monomer of a wafer passivation composition of the invention. In other embodiments, the low modulus polyimides may be combined with other monomers, such as thermoset monomers, to make a fully formulated wafer passivation composition.

In certain embodiments of the invention, the low modulus polyimide is present in a composition, such as a wafer passivation composition, in an amount from 0.5 weight percent (wt %) to about 98 wt %, based on the total weight of the composition. Typically, the composition will contain an amount of the low modulus polyimide equal to at least about 40 wt %, often at least about 60 wt %, frequently at least about 80 wt %,

TABLE 1

Comparison of Invention Polyimide Polymers with Conventional Polyimide Polymers

| Invention Polyimide Polymer | Conventional Polyimide |
|---|---|
| Flexible aliphatic backbone | Stiff aromatic ether backbone |
| Fast, chain propagation cure mechanism | Slow, ring-closing condensation cure mechanism |
| Proprietary imide-extended maleimide chemistry | Non-proprietary chemistry |
| Single component system in solvent for spin coating and also available as spin-coatable (90° C.) solventless system | Two component system in solvent for spin coating |
| Solventless spinning eliminates need for EBR (Edge Bead Removal) | EBR typically required as well as backside rinse in solvent containing spin coating solutions |
| Inherent UV active polymer (no photo initiator needed) | Secondary functional group and photo initiator must be added |
| Developable in standard organic solvents (supercritical $CO_2$ can also be used) | Requires caustic and corrosive high pH TMAH (tetramethylammonium hydroxide) |
| Fully cured with UV (post bake is optional) | Requires hard bake after exposure/develop |
| Thermal decomposition temperature >400° C. | Same as Invention Polyimide Polymers |
| Inherent high adhesion to metals, including Au | Typically requires toxic/corrosive organosilane pretreatments |
| Free radical cure in less than 15 minutes at <185° C. (if needed) | Cure is 200° C. for 30 min + 325° C. for 60 minutes |
| Low modulus <500 MPa | High modulus >2000 MPa |
| Low cure shrinkage | Thickness reduction of 50-60% from deposit to hard bake |

The present invention thus provides passivation layers for semiconductor wafers that include low modulus (<500 MPa) and low cure shrinkage polyimide materials. Exemplary polyimide materials for use in the methods of the present invention are described in U.S. Pat. No. 7,208,566, the conand in some embodiments at least about 95 wt % based on the total weight of the composition (after all the solvent has been removed).

In another embodiment of the invention, the composition containing the low modulus polyimide includes at least one co-monomer, which is typically present in an amount from 10 wt % to about 90 wt %, based on the total weight of the composition. In some aspects of the invention, the composition will contain an amount of the co-monomer equal to at least about 15 wt %, often at least about 20 wt %, frequently at least about 25 wt %, and in some embodiments at least about 30 wt % based on the total weight of the composition. Co-monomers suitable for use in the polyimide-containing compositions according to the invention include, but are not limited to, acrylates, acrylamides, methacrylates, methacrylamides, cyanate esters, maleimides, vinyl ethers, vinyl esters, styrenic compounds, allyl functional compounds, epoxies, epoxy curatives, and olefins.

Curing Initiators. In certain embodiments, the present invention provides compositions, such as adhesive compositions, including at least one low modulus polyimide and at least one curing initiator. The curing initiator is typically present in adhesive compositions of the invention at an amount from 0.1 wt % to about 5 wt %, based on total weight of the composition, and is typically a free-radical initiator. In some embodiments, the curing initiator is present at least about 0.5 wt %, often at least about 1 wt %, frequently at least about 2 wt %, at in some embodiments at least about 3 wt %, based on total weight of the composition.

Free-radical initiators contemplated for use in the practice of the present invention typically decompose (i.e., have a half life in the range of about 10 hours) at temperatures in the range of about 70° C. up to 180° C. Exemplary free radical initiators contemplated for use in the practice of the present invention include peroxides (e.g. dicumyl peroxide, dibenzoyl peroxide, 2-butanone peroxide, tert-butyl perbenzoate, di-tert-butyl peroxide, 2,5-bis(tert-butylperoxy)-2,5-dimethylhexane, bis(tert-butyl peroxyisopropyl)benzene, and tert-butyl hydroperoxide), azo compounds (e.g., 2,2'-azobis(2-methyl-propanenitrile), 2,2'-azobis(2-methylbutanenitrile), and 1,1'-azobis(cyclohexanecarbonitrile)). Other free-radical initiators that will be well-known in the art may also be suitable for use in the compositions of the present invention.

Photoinitiators.

Free radical initiators also include photoinitiators. For invention compositions that contain a photoinitiator, the curing process can be initiated, for example, by UV radiation. In one embodiment, the photoinitiator is present at a concentration of 0.1 wt % to 5 wt %, based on the total weight of the organic compounds in the composition (excluding any filler). In one embodiment, the photoinitiator comprises 0.5 wt % to 3.0 wt %, based on the total weight of the organic compounds in the composition. In other embodiments, the photoinitiator is present at least about 0.5 wt %, often at least about 1 wt %, frequently at least about 2 wt %, and in some embodiments at least about 3 wt %, based on the total weight of the organic compounds in the composition. Photoinitiators include benzoin derivatives, benzilketals, $\alpha,\alpha$-dialkoxyacetophenones, $\alpha$-hydroxyalkylphenones, $\alpha$-aminoalkylphenones, acylphosphine oxides, titanocene compounds, combinations of benzophenones and amines or Michler's ketone, and the like.

In some embodiments, both photoinitiation and thermal initiation may be desirable. For example, curing of a photoinitiator-containing adhesive can be started by UV irradiation, and in a later processing step, curing can be completed by the application of heat to accomplish a free-radical cure. Both UV and thermal initiators may therefore be added to the adhesive compositions of the invention.

Additional Co-Curing Compounds.

In certain aspects, the compositions, such as adhesive compositions of the invention include at least one additional compound that can co-cure with the low modulus polyimides. The additional compound is typically present in a wafer passivation composition from about 10 wt % to about 90 wt % based on total weight of the composition. In such aspects, the composition will typically contain an amount of the co-curing compound equal to at least about 20 wt %, often at least about 30 wt %, frequently at least about 40 wt %, and in some embodiments at least about 50 wt % based on the total weight of the composition.

Such compounds include, for example, epoxies (e.g. epoxies based on glydicyl ethers of alcohols, phenols, bisphenols, oligomeric phenolics, phenolic novolacs, cresolic novolacs, acrylates, methacrylates, maleimides, poly-phenol compounds (e.g. poly(4-hydroxystyrene)), anhydrides, dianhydrides, polyanhydrides such as styrene-maleic anhydride co-polymers, imides, carboxylic acids, dithiols, polythiols, phenol functional mono-maleimides, bismaleimides, polymaleimides, mono-itaconates, mono-maleates, mono-fumarates, acrylic acid, methacrylic acid, cyanate esters, vinyl ethers, vinyl esters, or phenol functional esters, ureas, amides, polyolefins (e.g. amine, carboxylic acid, hydroxy, and epoxy functional) siloxanes (e.g. epoxy, phenolic, carboxylic acid, or thiol functional), cyanoacrylates, allyl functional compounds and styrenic, as well as combinations thereof. In yet further embodiments, the invention provides cured adhesives prepared from compositions that include at least one low modulus polyimide.

Coupling Agents.

In certain aspects, the adhesive compositions of the invention include at least one additional coupling agent. Exemplary coupling agents contemplated for use in the practice of the present invention include silicate esters, metal acrylate salts (e.g., aluminum methacrylate), titanates (e.g., titanium methacryloxyethylacetoacetate triisopropoxide), zirconates, or compounds that contain a copolymerizable group and a chelating ligand (e.g., phosphine, mercaptan, acetoacetate, and the like). In some embodiments, the coupling agent contains both a copolymerizable function (e.g., vinyl, acrylate, methacrylate, epoxy, thiol, anhydride, isocyanate, and phenol moieties) and a silicate ester function. The silicate ester portion of the coupling agent is capable of condensing with metal hydroxides present on the mineral surface of substrate, while the co-polymerizable function is capable of co-polymerizing with the other reactive components of invention wafer passivation compositions. In certain embodiments coupling agents contemplated for use in the practice of the invention are oligomeric silicate coupling agents such as poly(methoxyvinylsiloxane).

Wafer Passivation Compositions

In certain embodiments, the present invention provides wafer passivation compositions that are of various consistencies including, liquids, solutions, pastes and thermoplastic solids. In one embodiment, the wafer passivation composition is a solution containing a fully-imidized BMI oligomer suitable for spin coating onto a wafer comprising multiple microelectronic devices.

In certain embodiments, a solvent may be employed in the practice of the invention. For example, when the wafer passivation compound is spin-coated onto a circular wafer, it is desirable to have an even coating throughout the entire wafer, i.e., the solvent or solvent system should have the ability to deliver the same amount of adhesive to each point on the wafer. Thus, the wafer passivation compound will be evenly coated throughout, i.e., there will be the same amount of material at the center of the wafer as at the edges. Ideally, the solution of the wafer passivation compound is "Newtonian", with a thixotropic slope of 1.0. In certain embodiments, the solutions used to dispense the wafer passivation compound have slopes ranging from 1.0 to about 1.2.

In some embodiments, the solvent or solvent system has a boiling point ranging from about 100° C. up to about 150° C. In some embodiments, the solvent is toluene.

In general, the wafer passivation compositions of the invention, will photoimage under the influence of UV light at or near room temperature. All non-developed portions of the passivation film can then be removed via soaking in, or application of a jet spray of, an appropriate solvent or combination of solvents. The remaining photocured polyimide film could then be fully cured via a post-bake at 180-220° C. for approximately fifteen minutes to one hour.

Inhibitors for free-radical cure may also be added to the adhesive compositions and die-attach pastes described herein to extend the useful shelf life. Examples of free-radical inhibitors include hindered phenols such as 2,6-di-tert-butyl-4-methylphenol; 2,6-di-tert-butyl-4-methoxyphenol; tert-butyl hydroquinone; tetrakis(methylene(3,5-di-tert-butyl-4-hydroxyhydrocinnamate))benzene; 2,2'-methylenebis(6-tert-butyl-p-cresol); and 1,3,5-trimethyl-2,4,6-tris(3',5'-di-tert-butyl-4-hydroxybenzyl)benzene. Other useful hydrogen-donating antioxidants such as derivatives of p-phenylenediamine and diphenylamine. It is also well know in the art that hydrogen-donating antioxidants may be synergistically combined with quinones and metal deactivators to make a very efficient inhibitor package. Examples of suitable quinones include benzoquinone, 2-tert butyl-1,4-benzoquinone; 2-phenyl-1,4-benzoquinone; naphthoquinone, and 2,5-dichloro-1,4-benzoquinone. Examples of metal deactivators include N,N'-bis(3,5-di-tert-butyl-4-hydroxyhydrocinnamoyl)hydrazine; oxalyl bis(benzylidenehydrazide); and N-phenyl-N'-(4-toluenesulfonyl)-p-phenylenediamine. Nitroxyl radical compounds such as TEMPO (2,2,6,6-tetramethyl-1-piperidnyloxy, free radical) are also effective as inhibitors at low concentrations. The total amount of antioxidant plus synergists typically falls in the range of 100 to 2000 ppm relative to the weight of total base resin. Other additives, such as adhesion promoters, in types and amounts known in the art, may also be added.

Properties of Wafer Passivation Coatings Containing Low Modulus Polyimides

Advantageously, the low modulus, imide-extended BMI compounds of the invention can impart many properties that are desirable in a passivation coating. Historically, polyimide coatings for wafer passivation have been based on high $T_g$ resins that are either formed in situ on the wafer surface via cyclodehydration of their amic acid precursors, or if pre-imidized, are only soluble in high boiling, expensive solvents such as N-methyl-2-pyrrolidone (NMP) which is difficult to remove from the final film. The passivation layer compositions of the invention contain low modulus, imide-extended BMI compounds that are fully imidized oligomers and can be spin coated onto the wafer either neat or dissolved in a variety of low cost, readily available solvents. The imide-extended BMI compounds of this invention are also intrinsically photoimagable and do not require the addition of photoinitiators in order to cure under mid-range UV light. The compounds of this invention are intrinsically hydrophobic and have significantly lower moisture absorption when fully cured than the traditional polyimide coatings, which can absorb as much as 4-5% moisture by weight. Furthermore, the compounds of this invention provide low modulus coatings after cure and thus are much better suited for use on thinned silicon devices.

The polyimide resins of this invention cure to low modulus films. The modulus of these films, post cure, is less than about 2,000 MPa at 25° C., such as less than about 1,000 MPa at 25° C., for example, less than about 100 MPa at 25° C., e.g., less than about 25 MPa at 25° C.

The invention will now be further described with reference to by the following illustrative, non-limiting examples.

EXAMPLES

Example 1

Elongation/Breaking Strength—Dogbone Samples on Instron

Tensile strength and elongation were measured on an imide-extended bismaleimide resin that had been prepared according to U.S. Pat. No. 7,208,566 in order to demonstrate the mechanical characteristics of compositions of the invention. The resin used in this example was prepared according to Example 5 of that U.S. Pat. No. 7,208,566. The resin had been precipitated into acetone to remove any remaining lower molecular weight residues. In this form (designated as R1130) the approximate molecular weight of the imide extended bismaleimide is around 3,000 Daltons (and is therefore also known as BMI-3000). In this example, two cure conditions were examined: (a) cured via UV exposure only, and (b) UV exposure followed by a thermal post reaction. The UV process parameters were not optimized for intensity, wavelength or protection from $O_2$ inhibition. Specimen dimensions were: 13 mm wide×1.3 mm thick. The photoinitiator (when present) in this example and in all other examples that follow was Irgacure 819 (Ciba). The thermal initiator (when present) in this example and in all other examples that follow was dicumyl peroxide (DCP).

The results in Table 2 show that the tensile strength of the UV-only cured material is 7.7 MPa and has 113% elongation. Both the tensile strength and the elongation of the UV cured material increased by about 40% after a three-hour heat treatment at 175° C. in the presence of one-weight percent DCP. This may be a result of the relatively thick dogbone specimen required for Instron testing or the specimen could have been under cured using the UV exposure conditions in this experiment. The final numbers demonstrate that the invention material has lower strength but more elongation than standard polyimides. This demonstrates that compositions of the invention are suited to use as low stress passivation layers.

TABLE 2

Test Results for Dogbone Samples of BMI

| Formulation | Cure Condition | Breaking Strength, MPa | Elongation, % |
| --- | --- | --- | --- |
| R1130 + 0.5% UV initiator | 30 min. UV | 7.7 | 113 |
| R1130 + 0.5% UV initiator + 1% DCP | 30 min. UV + 3 hr at 175° C. | 11.1 | 154 |

Example 2

Trials Using Toluene as the Image Development Solvent

Figure 2:
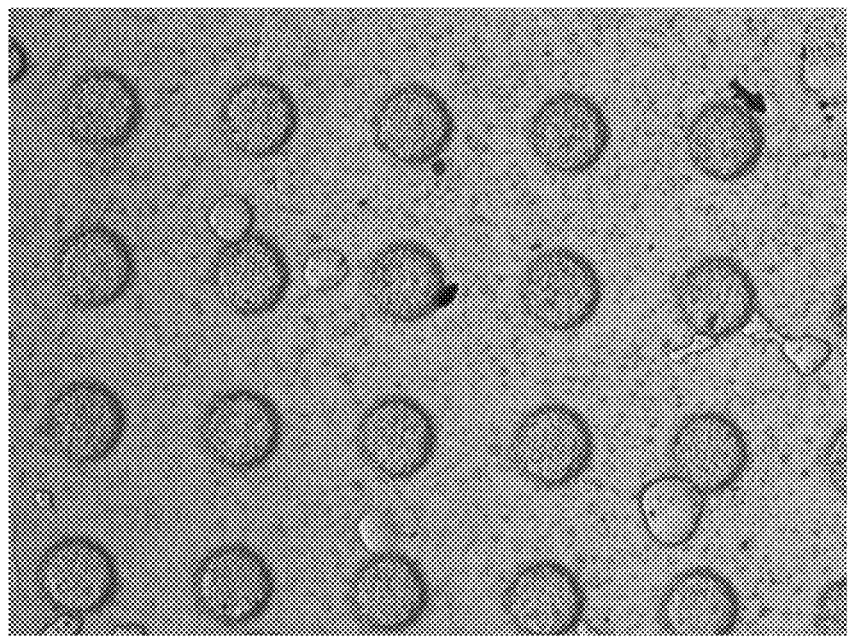
Figure 3:
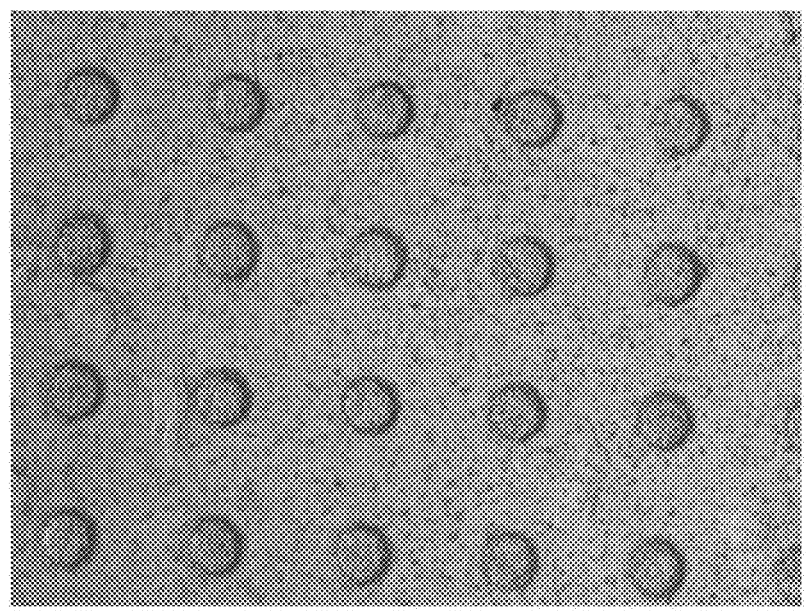

FIGS. 1-3 show the performance of the materials of the invention in the additional trials that illustrate the applicability of the compositions of the invention to photoimaging applications. Additional trials were performed using the low modulus, imide-extended BMI. Here and below, compound R1184, which was used as such imide-extended BMI, is the compound described in Example 5 of the above-mentioned U.S. Pat. No. 7,208,566, without a subsequent precipitation step, the compound having a molecular weight of about 2,000 Daltons. Compound R1184 was doctor-bladed onto ceramic wafers to form an even coating, followed by UV exposures through masks. The doctor-bladed films were exposed to a broad-spectrum UV light source with the mask interposed between the un-cured film and the light source. The photoimaged films were then developed using a jet of toluene.

Figure 4:
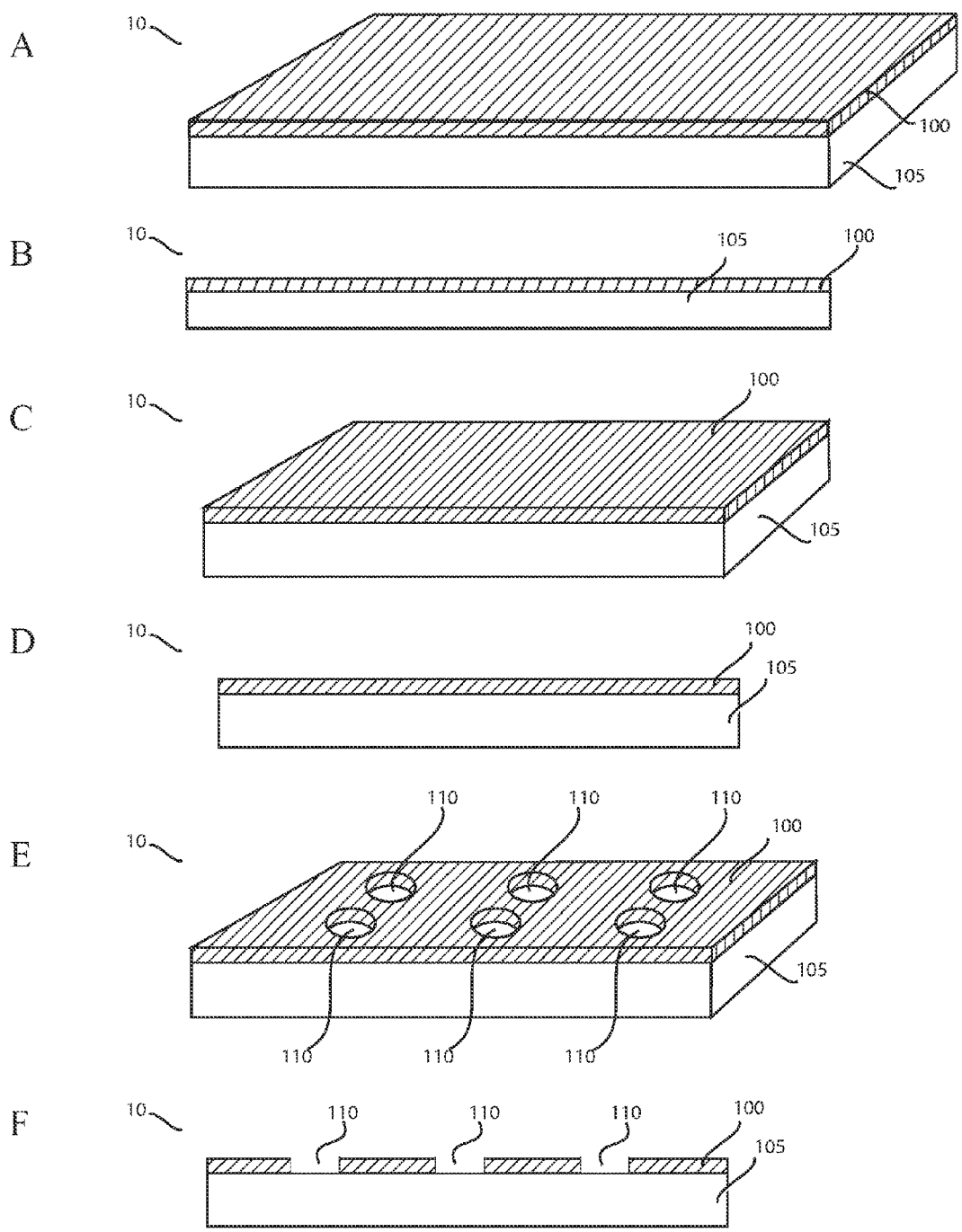

The circular areas in the developed images directly correspond to opaque areas of the mask. The areas of the imide-extended BMI film surrounding the circular holes correspond to transparent areas in the mask. The photoimaging process followed by development reproduced the pattern of the mask with excellent fidelity. FIG. 1 (8 mil dots, 20 mil spacing) shows the developed photoimaged film in which the mask had 8 mil diameter opaque dots with 20 mil center-to-center spacing. The developed film has 7.8 mil circular holes with 19.2 mil spacing between holes. FIG. 2 (5 mil dots, 10 mil spacing) shows a developed film that has 4.6 mil holes and 9.5 mil spacing between holes (the nominal values for the mask were 5 mils and 10 mils, respectively). FIG. 3 (3 mil dots, 10 mil spacing) shows a developed film with 3.4 mil holes and 10 mil spacing (the mask nominal values were 3 mils and 10 mils, respectively). FIG. 4 shows three different wafer/passivating layer combinations, each in perspective and cross-section views. As can be seen from FIG. 4, in some exemplary devices 10 of the present invention, the passivating layer 100 can be disposed on the top of the wafer 105, the passivating layer 100 comprising the holes 110. The embodiments depicted on FIGS. 4A and 4B show schematically a fully encapsulated wafer 105; the embodiments depicted on FIGS. 4C and 4D show the a section of the center of wafer 105 (having its ends removed); and the devices 10 depicted on FIGS. 4E and 4F illustrate the same center with the holes 110 in the passivating layer 100 formed by photolithography.

Toluene is effective at removing uncured BMI oligomer, however, it continues to prove to be aggressive towards UV-cured BMI resin as well, even towards a BMI oligomer with the crosslinking bolstered by an additional 10% of R1091 (X-BMI) described below. This fact is manifested by its ability to plasticise and/or loosen the grip of the films on substrates. Acetone appears to be a better choice as an image development solvent, in that it has sufficient solvent power to dissolve the unexposed areas of the film, but does not plasticise the exposed areas.

R1091 is X-BMI, which is dimer diamine BMI prepared as described in U.S. Pat. No. 5,973,166, the entire contents of which is incorporated by reference herein. X-BMI is a product which is described in U.S. Pat. No. 5,973,166 (see Example 6 of this U.S. patent, the fourth product in Table 2).

Example 3

Trials Using Cyclohexanone as the Image Development Solvent

Cyclohexanone proved to be a suitable solvent for developing photoimaged patterns in compositions of the invention. In this example, the film was spin coated on wafers to achieve 13 um thickness. Coating conditions were: (1) spin 30 seconds at 590 rpm; (2) spin 30 seconds at 1196 rpm; (3) bake 30 minutes at 100° C. (surface is non-tacky). The imaged and developed pattern was characterized using a contact profilometer. In all cases, the replication of mask dimension in the imaged pattern was excellent with very good edge definition. Some of the developing with cyclohexanone was done using s spray device, but flooding followed by a simple rinse with acetone was just as effective. This demonstrates that compositions of the invention are suited to use as photoimagable passivation layers.

Example 4

Thermogravimetric Analysis (TGA)

Percent weight loss was measured using thermogravimetric analysis (TGA) in order to demonstrate the thermal stability of compositions of the invention. Specimens for this example were made using the same mold and methods as in Example 1, i.e., two cure conditions were examined: (a) cured via UV exposure only, and (b) UV exposure followed by a thermal post reaction. The UV process parameters were not optimized for intensity, wavelength or protection from $O_2$ inhibition. Specimen dimensions were: 13 mm wide×1.3 mm thick.

The TGA results in Table 3 show that the percent weight loss of the UV-only cured material tends to be slightly higher than the material with the UV plus thermal post cure. This may be a result of the relatively thick dogbone mold used here (required for Instron testing) could have been under cured using the UV exposure conditions in this experiment. A fresh sample of the UV-only cured material was run and showed good repeatability of the original weight loss ramp to 400° C., but in this case the TGA was programmed to cool to room temperature then immediately ramp back up again to 400° C. On this second ramp to 400° C. the percent weight loss was significantly reduced.

TABLE 3

TGA Results

| Formulation | Cure Conditions | Weight Loss, %, At a Temperature | | | | | Decomposition Temperature, ° C. |
|---|---|---|---|---|---|---|---|
| | | 100° C. | 200° C. | 260° C. | 300° C. | 400° C. | |
| R1130 + 0.5% UV initiator | 30 min. UV | 0.34 | 0.90 | 1.08 | 1.70 | 4.04 | 471 |
| R1130 + 0.5% UV initiator + 1% DCP | 30 min. UV + 3 hr at 175° C. | 0.00 | 0.23 | 0.95 | 1.58 | 2.93 | 464 |

The results of the first and second ramp are shown in Table 4. Again, the UV process parameters were not optimized for intensity, wavelength or protection from $O_2$ inhibition. Specimen dimensions for UV exposure were: 13 mm wide×1.3 mm thick. Percentage of weight change shown in Table 4 is based on starting weight of each scan. The initial scan start weight was 8.878 mg and the second scan start weight was 8.534 mg.

The results shown in Table 4 indicate that after the more volatile under cured monomers were eliminated on the first ramp to 400° C., the remaining, cured polymer exhibited excellent thermal stability during the second ramp to 400° C. Overall, the TGA results demonstrate that the invention material has thermal stability at least equivalent to standard polyimides. Additional TGA testing yielded similar results on a sample using the following materials: R1184+2% DCP UV cured 30 minutes followed by 1 hour at 180° C.

TABLE 4

Weight Change Before and After Exposure to 400° C. Using TGA

| Formulation | Cure Conditions | Weight Change, %, At a Temperature | | | | |
|---|---|---|---|---|---|---|
| | | 100° C. | 200° C. | 260° C. | 300° C. | 400° C. |
| R1130 + 0.5% UV initiator | 30 min. UV | +0.007 | −0.145 | −0.434 | −0.955 | −3.723 |
| R1130 + 0.5% UV initiator | Cool the sample above to room temperature and repeat the TGA scan | +0.042 | +0.022 | −0.018 | −0.060 | −0.644 |

Example 5

Thermo-Analysis (DMA)

Modulus and the glass transition temperature $T_g$ of compositions of the invention were measured using dynamic mechanical analysis (DMA). Two cure conditions were examined: (a) cured via UV exposure only, and (b) UV exposure followed by a thermal post reaction. Again, the UV process parameters were not optimized for intensity, wavelength or protection from $O_2$ inhibition. Specimen dimensions were: 6.2 mm wide×0.6 mm thick. In this case, the specimens were molded as thin films, not thick dogbones, so there was very little difference observed in the results between the two cure conditions. The DMA results provided in Table 5 show that the modulus is much lower than standard polyimides (typically, >2,000 MPa at 25° C.) and that the Tg is near room temperature. This suggests that the cured invention polyimide is a low stress material for passivation.

TABLE 5

Modulus and $T_g$ Data Obtained by Using DMA

| Formulation | Cure Conditions | E' Units, MPa, At a Temperature | | | $T_g$, ° C. |
|---|---|---|---|---|---|
| | | 25° C. | 150° C. | 260° C. | |
| R1184 (no additives) | 30 min. UV | 146 | 4 | 6 | 19 |
| R1130 + 0.5% UV initiator + 1% DCP | 15 min. UV + 1 hr at 175° C. | 154 | 3 | <1 | <25 |

The DMA scan of another formulation prepared using the following materials: R1184+2% DCP; UV cured 30 minutes followed by 1 hour at 180° C. The temperature sweep was run from 25° C. to 305° C. and three series of data points were collected: E' (elastic, or storage modulus); E"(loss modulus); and tan delta (the ratio of E'/E"). The peak in the tan delta series indicates that the glass transition temperature was about 35° C. The room temperature modulus was around 160 MPa (1 dyn/cm$^2$=10 Pa, & 1 MPa=1,000,000 Pa).

Example 6

Moisture Uptake

Weight gain after water immersion was measured in order to demonstrate the hydrophobicity of compositions of the invention. In this example, two water immersion test conditions are reported in Table 6 which shows the moisture saturation content did not exceed 1% weight gain. Cure times varied from 120 to 216 hours. The rate to reach saturation was observed to be quite slow, i.e., in the 80° C. test condition it took 24 hours to reach saturation. This clearly demonstrates that the cured invention polyimide is hydrophobic.

TABLE 6

Moisture Uptake Results

| Formulation | Cure Condition | Water Immersion Condition | Weight Gain, % |
|---|---|---|---|
| R1130 + 1% DCP | 140° C. | 288 hours at 80° C. | 0.4% |
| R1130 + 1% DCP | 140° C. | 65 hours at 150° C. | 0.8% |

Example 7

Deformation Under Pressure

Thermal Mechanical Analysis (TMA) was used to demonstrate that cured compositions of the invention will have resistance to flow under pressure. In this example, two test conditions were achieved by placing two mass loads (5 grams and 20 grams) on separate cured specimens and ramping them from 100° C. to 350° C. while monitoring the deflection of the TMA probe. No deformation or deflection was observed at either test condition. Formulation used was melt mixed R1130+1.0% DCP then cured 3.5 hr at 175° C. Maximum pressure achieved in these experiments was about 70 g/cm$^2$ with zero flow or deflection observed up to 350° C. This result demonstrated that the cured invention polyimide was very resistant to flow over the entire temperature range of the experiment.

Example 8

Vertical Shrinkage

Minimal dimensional change during the wafer coating process is an important feature for making passivation films and especially for building up dielectric interlayers. Typically, polyimides are formed in situ through cyclodehydration of the polyamic acid precursors. This imidization step also requires the evaporation of high boiling, polar aprotic solvents. As a result, film thickness reduction of 50-60% can occur from deposit to hard bake. This invention utilizes free radical initiation of chain propagation and extension during the cure reaction.

Film thickness was measured in order to demonstrate the minimal vertical shrinkage of compositions of the invention. In this example, two parts were built and measured for thickness at four locations each at four different stages of the coat and cure process: (a) after spin coat and dry; (b) after UV cure; (c) after image developing in cyclohexanone; and (d) after bake. The thickness values are presented in Table 7. Overall vertical shrinkage throughout the process was <1.5% with very little swelling observed after solvent developing. This clearly demonstrates that the cured invention polyimide is a low shrinkage polymer. Formulation used in this example: 50% R1130 in toluene+0.5% UV Initiator+1.0% DCP; viscosity ≅300 cPs.

TABLE 7

BMI-3000 Formulation was tested for Vertical Shrinkage.

| Part Number | Thickness, μm, after Spin Coat and Dry 30 minutes at 90° | Thickness, μm, after UV Cure 15 minutes | Thickness, μm, after Develop 1 minute dip in Cyclohexanone | Thickness, μm, after Bake 60 minutes at 200° C. |
|---|---|---|---|---|
| 1 | 9.99 ± 0.11 | 10.24 ± 0.14 | 10.22 ± 0.16 | 9.84 ± 0.12 |
| 2 | 9.99 ± 0.49 | 10.24 ± 0.47 | 10.18 ± 0.50 | 9.85 ± 0.47 |

Example 9

Degree of Planarization (DOP)

An initial pattern of 250 μm lines and spaces was coated, imaged and cured to 11 μm thickness using a composition of the invention material. The topography of this initial pattern was then characterized by scanning with a profilometer. A second layer was coated, UV cured, but not imaged over the initial patterned layer. Subsequent profilometer scans indicate that the degree of planarization achieved was DOP=98.7% after the UV cure of the second coating. A post bake at 200° C. for 60 minutes increased the DOP=99.1% for the second coating. The formulation used in this example was: 50% R1130 in toluene+0.5% UV Initiator+1.0% DCP; viscosity ≅300 cPs. This demonstrates that the cured invention polyimide is capable of planarizing underlying topography.

Example 10

Warpage and Residual Stress

Warpage after wafer coat and cure was measured in order to calculate the residual stress induced by compositions of the invention. In this example, three 200 mm diameter silicon wafers having the thickness of 725 μm were spin coated at three different coating thicknesses. Each coating was dried 30 minutes at 60° C. and then cured for 60 minutes at 175° C. ($N_2$ purge oven). The formulation used in this example was: 40% BMI 3000 in toluene with 0.8% DCP peroxide; viscosity=123 cPs.

The results are provided in table 8. Wafer bow changed from flat to concave (smiley face) after cure and was less than 11 μm in all cases. Average residual stress was calculated to be 1.9±0.2 MPa using the Stoney Equation (see, Felix Lu, "Physical Mechanisms of Residual Stress in Metallic Thin Films" Feb. 19, 2008 Applied Quantum Technologies/Duke University, 24 pages). Wafers using standard polyimides are reported to have concave bow of >20 μm and residual stress of about 25 MPa. This demonstrates that the cured invention polyimide is low stress.

TABLE 8

BMI-3000 Warpage and Residual Stress

| Wafer Number | 1 | 2 | 3 |
|---|---|---|---|
| Spin, rpm | 1,000 | 2,000 | 3,000 |
| Coating Thickness, μm | 10.64 | 8.38 | 6.3 |
| Final Bow, μm | 6.8 | 4.4 | 3.7 |
| Residual Stress, MPa | 2.06 | 1.70 | 1.90 |

Example 11

Crosslinking Conversion—UV Cure With and Without Photoinitiator

The thermoset cure reaction mechanism for the invention is free radical initiation at the carbon-carbon double bond in the maleimide function groups followed by chain propagation as the maleimide crosslinks by forming a carbon-carbon single bond to another maleimide containing monomer. The extent of cure, then, can be tracked by following the conversion in the maleimide of carbon-carbon double bonds to carbon-carbon single bonds. In this example, FTIR was used to track the absorbance of the carbon-carbon double bond vibrational energies in maleimide at 827 (out-of-plane bending mode for —C—H) and 696 in-plane deformation of maleimide ring) wavenumbers as a function of UV exposure time. The sample method used was reflectance spectroscopy obtained from a thin film dried on an ATR crystal and then placed directly in the UV exposure chamber. One composition of the invention in this example was formulated with 0.5% of a photoinitiator to catalyze the formation of free radicals, which in turn result in polymerization of the maleimide functional groups in the BMI-3000. The cure energy density of the UV at 365 nm was 650 mJ/cm$^2$. The reduction in absorbance at 696 wavenumbers shown in Table 9 correlates with increasing exposure time and indicates that crosslinking is occurring and that there is nearly 100% cure conversion after 30 minutes of UV exposure.

TABLE 9

Tracking Cross-linking Conversion Using FTIR for BMI-3000 Formulations

| UV Exposure Time, minutes | Relative Area of 696 cm$^{-1}$ Peak with no Photoinitiator | Relative Area of 696 cm$^{-1}$ Peak with 0.5% Photoinitiator |
|---|---|---|
| 0 | 100.0 | 100.0 |
| 1 | 82.0 | 72.4 |
| 5 | 35.1 | 22.1 |
| 15 | 4.8 | 2.8 |
| 30 | 1.1 | 0.5 |

Example 12

Crosslinking Conversion—UV Cure without Photoinitiator

This example is an extension of Example 11. The composition of the invention in this example did not contain a photoinitiator. The BMI of the invention is inherently photoactive and therefore does not require a photoinitiator to generate free radicals at the maleimide during UV exposure. As described above in Example 11, the extent of cure can be tracked using FTIR to follow the conversion in the maleimide of carbon-carbon double bonds to carbon-carbon single bonds. In this example, FTIR is used to track the absorbance of the carbon-carbon double bond vibrational energies in maleimide at 827 and 696 wavenumbers as a function of UV exposure time.

The reduction in absorbance at 696 wavenumbers shown in Table 9 correlates with increasing exposure time and indicates that crosslinking is occurring even without a photoinitiator and that there is nearly 100% cure conversion after 30 minutes of UV exposure. The inclusion of a photoinitiator therefore produced a slight increase in the initial reaction rate, but both systems, with and without photoinitiator, can achieve the same final UV cure.

Example 13

Crosslinking Conversion—Thermal Cure with Dicumyl Peroxide

This example is an extension of Example 11. The composition of the invention in this example was formulated to contain a peroxide free radical initiator in place of a photoinitiator. The cure mechanism remains the same, but thermal energy is used to activate the peroxide catalyst, not UV energy. As described above in Example 11, the extent of cure can be tracked using FTIR to follow the conversion in the maleimide of carbon-carbon double bonds to carbon-carbon single bonds. In this example, FTIR is used to track the absorbance of the carbon-carbon double bond vibrational energies in maleimide at 827 and 696 wavenumbers before and after a thermal bake (no UV exposure).

The sample method used was a thin film dried on a NaCl plate and transmission spectra collected before and after bake at 200° C. for 60 minutes in air convection oven. The Relative Area of the 696 cm$^{-1}$ peak changed from 100.0 to 0.5 after the bake. The reduction in absorbance observed before and after bake indicates that crosslinking is occurring and that there is nearly 100% cure conversion after a thermal cure as there had also been with UV cure.

Although only a few embodiments have been described in detail and exemplified above, those having ordinary skill in the art will clearly understand that many modifications are possible in the described embodiments without departing from the teachings thereof. All such modifications are intended to be encompassed within the following claims.

What is claimed is:

1. A device, comprising a semiconductor wafer and a passivating layer disposed on the surface of the wafer, wherein the passivating layer is comprised of a polyimide polymer comprising a structure selected from the group consisting of structures I, II and III:

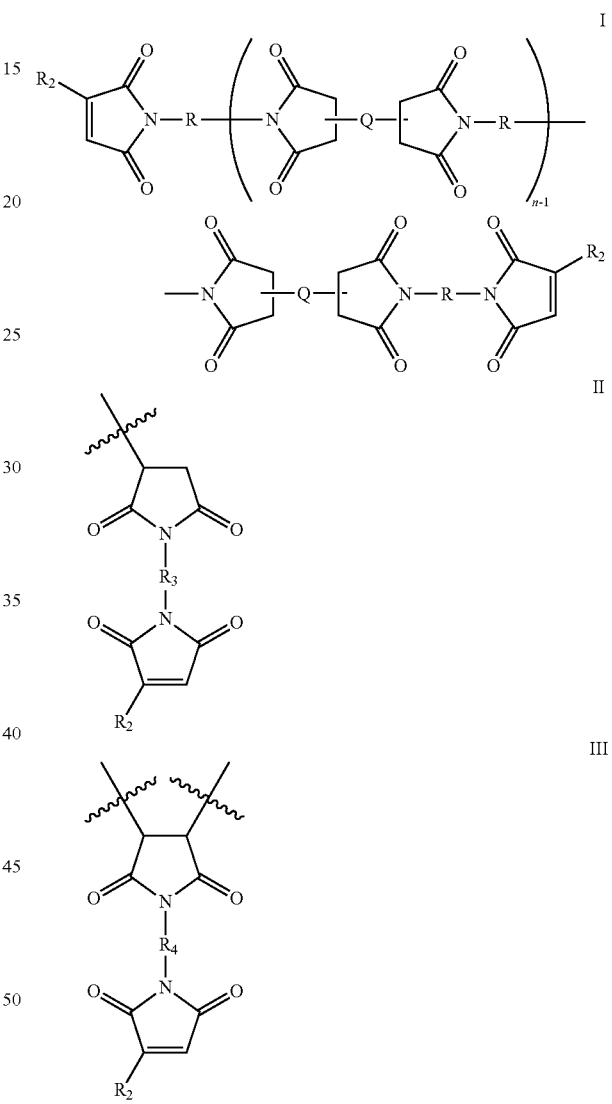

wherein:
each of R, $R_3$ and Q is independently selected from the group consisting of substituted or unsubstituted aliphatic, alkenyl, aromatic, heteroaromatic and siloxane moieties;
$R_2$ in each of structures I, II and III is independently selected from the group consisting of H or methyl;
$R_4$ is selected from the group consisting of substituted or unsubstituted linear, branched, cyclic aliphatic or alkenyl moieties having between 2 and about 500 carbon atoms, and substituted or unsubstituted aromatic moieties;

n is an integer having the value between 1 to about 10; and
the symbol "~~~" depicts a macromolecular chain to which the structure II or III is covalently attached,
with the further proviso that in the polyimide polymer, the molecular weight fraction of the combined contents of nitrogen and oxygen is less than about 20%.

2. The device of claim 1, wherein the molecular weight fraction of the combined contents of nitrogen and oxygen is less than about 15%.

3. The device of claim 1, wherein the molecular weight fraction of the combined contents of nitrogen and oxygen is less than about 12%.

4. The device of claim 1, wherein each of R, R₃ and Q is independently selected from the group consisting of substituted or unsubstituted aromatic or heteroaromatic moieties having between 6 and about 14 carbon atoms.

5. The device of claim 1, wherein each of R, R₃ and Q is independently selected from the group consisting of substituted or unsubstituted siloxane moieties having between 2 and about 50 silicon atoms.

6. The device of claim 1, wherein the siloxane moiety is a polysiloxane.

7. The device of claim 6, wherein the polysiloxane comprises repeating units selected from the group consisting of dimethylsiloxane, methylphenylsiloxane, diphenylsiloxane and combinations thereof.

8. The device of claim 1, wherein substituted aliphatic, aromatic, heteroaromatic, or siloxane moieties comprise substituents selected from the group consisting of an alkyl, an alkenyl, an alkynyl, hydroxyl, oxo, an alkoxy, mercapto, a cycloalkyl, a substituted cycloalkyl, a heterocyclic, a substituted heterocyclic, an aryl, a substituted aryl, a heteroaryl, a substituted heteroaryl, an aryloxy, a substituted aryloxy, a halogen, a haloalkyl, cyano, nitro, nitrone, an amino, an amido, —C(O)H, —C(O)—, —C(O)—, —S—, —S(O)₂—, —OC(O)—O—, —NR—C(O)—, —NR—C(O)—NR—, and —OC(O)—NR—, wherein R selected from the group consisting of is H, a lower alkyl, an acyl, an oxyacyl, carboxyl, carbamate, sulfonyl, sulfonamide and sulfuryl.

9. The device of claim 1, wherein the polyimide forming the passivating layer cures to form a film having, post cure, the modulus that is less than about 2,000 MPa at 25° C.

10. The device of claim 9, wherein the modulus is less than about 1,000 MPa at 25° C.

11. The device of claim 9, wherein the modulus is less than about 100 MPa at 25° C.

12. The device of claim 9, wherein the modulus is less than about 25 MPa at 25° C.

13. A method for fabricating a device of claim 1, comprising:
(a) depositing a layer of a polyimide polymer on the surface of the semiconductor wafer; and
(b) curing the polyimide polymer, to thereby form a polyimide passivating layer on the surface of a semiconductor wafer,
wherein the polyimide polymer comprises a structure selected from the group consisting of structures I, II and III:

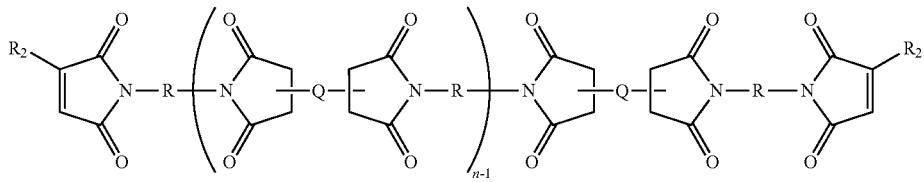

wherein:
each of R, R₃ and Q is independently selected from the group consisting of substituted or unsubstituted aliphatic, alkenyl, aromatic, heteroaromatic and siloxane moieties;
R₂ in each of structures I, II and III is independently selected from the group consisting of H or methyl;
R₄ is selected from the group consisting of substituted or unsubstituted linear, branched, cyclic aliphatic or alkenyl moieties having between 2 and about 500 carbon atoms, and substituted or unsubstituted aromatic moieties;
n is an integer having the value between 1 to about 10; and
the symbol "~~~" depicts a macromolecular chain to which the structure II or III is covalently attached,
with the further proviso that in the polyimide polymer, the molecular weight fraction of the combined contents of nitrogen and oxygen is less than about 20%,
to thereby fabricate the device.

14. The method of claim 13, wherein the molecular weight fraction of the combined contents of nitrogen and oxygen is less than about 15%.

15. The method of claim 13, wherein the molecular weight fraction of the combined contents of nitrogen and oxygen is less than about 12%.

16. The method of claim 13, wherein each of R, $R_3$ and Q is independently selected from the group consisting of substituted or unsubstituted aromatic or heteroaromatic moieties having between 6 and about 14 carbon atoms.

17. The method of claim 13, wherein each of R, $R_3$ and Q is independently selected from the group consisting of substituted or unsubstituted siloxane moieties having between 2 and about 50 silicon atoms.

18. The method of claim 13, wherein the siloxane moiety is a polysiloxane.

19. The method of claim 18, wherein the polysiloxane comprises repeating units selected from the group consisting of dimethylsiloxane, methylphenylsiloxane, diphenylsiloxane and combinations thereof.

20. The method of claim 13, wherein substituted aliphatic, aromatic, heteroaromatic, or siloxane moieties comprise substituents selected from the group consisting of an alkyl, an alkenyl, an alkynyl, hydroxyl, oxo, an alkoxy, mercapto, a cycloalkyl, a substituted cycloalkyl, a heterocyclic, a substituted heterocyclic, an aryl, a substituted aryl, a heteroaryl, a substituted heteroaryl, an aryloxy, a substituted aryloxy, a halogen, a haloalkyl, cyano, nitro, nitrone, an amino, an amido, —C(O)H, —C(O)—, —C(O)—, —S—, —S(O)$_2$—, —OC(O)—O—, —NR—C(O)—, —NR—C(O)—NR—, and —OC(O)—NR—, wherein R selected from the group consisting of is H, a lower alkyl, an acyl, an oxyacyl, carboxyl, carbamate, sulfonyl, sulfonamide and sulfuryl.

\* \* \* \* \*